(12) United States Patent
Babu et al.

(10) Patent No.: US 8,366,959 B2
(45) Date of Patent: Feb. 5, 2013

(54) ABRASIVE COMPOSITIONS FOR CHEMICAL MECHANICAL POLISHING AND METHODS FOR USING SAME

(75) Inventors: Suryadevara V. Babu, Potsdam, NY (US); Pradeepa Dandu, Potsdam, NY (US); Vamsi K Devarapalli, Stormville, NY (US); Guillaume Crinière, Ixelles (BE); Claire Pitois, Sunbyberg (SE)

(73) Assignees: Rhodia Operations, Aubervilliers (FR); Clarkson University, Potsdam, NY (US)

( * ) Notice: Subject to any disclaimer, the term of this patent is extended or adjusted under 35 U.S.C. 154(b) by 437 days.

(21) Appl. No.: 12/586,651

(22) Filed: Sep. 25, 2009

(65) Prior Publication Data

US 2010/0081281 A1    Apr. 1, 2010

Related U.S. Application Data

(60) Provisional application No. 61/194,497, filed on Sep. 26, 2008.

(51) Int. Cl.
    *C09K 13/06* (2006.01)
(52) U.S. Cl. .............. 252/79.4; 252/79.1; 438/693
(58) Field of Classification Search .......... 252/79.1, 252/79.2, 79.3, 79.4; 438/692, 693, 691; 216/88, 89
    See application file for complete search history.

(56) References Cited

U.S. PATENT DOCUMENTS

| | | | |
|---|---|---|---|
| 5,772,780 A | 6/1998 | Homma et al. ............... 134/7 |
| 6,043,155 A | 3/2000 | Homma et al. ............. 438/691 |
| 6,153,705 A | 11/2000 | Corpart et al. .............. 525/244 |
| 6,491,843 B1 | 12/2002 | Srinivasan et al. ........... 252/79.1 |
| 6,746,314 B2 | 6/2004 | Kim et al. .................... 451/41 |
| 6,933,340 B2 | 8/2005 | Herve et al. ................. 524/522 |
| 7,311,855 B2 | 12/2007 | Haga et al. ................. 252/79.1 |
| 7,531,105 B2 * | 5/2009 | Dysard et al. .............. 252/79.1 |
| 2004/0132305 A1 | 7/2004 | Nishimoto et al. .......... 438/690 |
| 2004/0203252 A1 | 10/2004 | Park ........................... 438/759 |
| 2005/0176863 A1 | 8/2005 | Yokota et al. ............... 524/403 |
| 2006/0084270 A1 | 4/2006 | Hiramitsu et al. ........... 438/691 |
| 2006/0099814 A1 | 5/2006 | Carter et al. | |

(Continued)

FOREIGN PATENT DOCUMENTS

| | | |
|---|---|---|
| WO | WO 98/01478 | 1/1998 |
| WO | WO 98/58974 | 12/1998 |

OTHER PUBLICATIONS

Schmolka, A Review of Block Polymer Surfactants, J. Am. Oil Chem. Soc. 1977, 54, 110-116.

(Continued)

*Primary Examiner* — Lan Vinh

(57) ABSTRACT

A colloidal dispersion for chemical mechanical polishing comprising: (a) an abrasive component; and (b) from about 0.05% to about 10% by weight of the abrasive component, a water-soluble amphoteric polymer comprising at least one macromolecular chain B and a part A bonded to a single end of the at least one macromolecular chain B, wherein the macromolecular chain B is derived from one or more ethylenically unsaturated monomers having quaternary ammonium groups or inium groups, and wherein the part A is a polymeric or nonpolymeric group comprising at least one anionic group; wherein the dispersion has a pH of between about 1.5 and about 6. The colloidal dispersion is capable of polishing a substrate comprising silicon nitride and silicon oxide with a reverse selectivity ratio of at least about 27, typically at least 50 the reverse selectivity ratio being the ratio of the rate of removal of the silicon nitride to the rate of removal of the silicon oxide.

19 Claims, 20 Drawing Sheets

Polish rates of blanket silicon dioxide and nitride films with 0.25% ceria slurry with and without cationic polymer as a function of pH (*polymer to ceria abrasive compound ratio* (X) =0.8)

U.S. PATENT DOCUMENTS

| | | | |
|---|---|---|---|
| 2006/0108326 A1 | 5/2006 | Dysard et al. | |
| 2007/0210278 A1* | 9/2007 | Lane et al. | 252/79.1 |
| 2007/0281483 A1* | 12/2007 | Mueller | 438/692 |
| 2008/0116171 A1 | 5/2008 | Babu et al. | 216/89 |
| 2008/0176982 A1 | 7/2008 | Haga et al. | |

OTHER PUBLICATIONS

Wilczek-Vera, et al., Macromolecules 1996, 29, 4036-4044 "Individual Block Length Distributions of Block Copolymers of Polystyrene-block-Poly(a-methylstyrene) by MALDI/TOF Mass Spectrometry".

Katayose and Kataoka, Water Soluble Polyion Complex Between DNA and PEG-Poly (1-Lysine) Block Copolymer for Novel Gene Vector, Proc. Intern. Symp. Control. Rel. Bioact. Materials, 1996, 23, 899-900.

Quirk and Lee, Experimental Criteria for Living Polymerizations, Polymer International 27, 359 (1992) 359-367.

International Preliminary Amendment dated Mar. 29, 2011 corresponding to International Patent Application No. PCT/US2009/005325.

Written Opinion dated Mar. 14, 2012 corresponding to Singapore Patent Application No. 2011021071-6.

* cited by examiner

Zeta potential: The solid curve is that corresponding to the product from Example 10 and it shows that the zeta potential is positive over the entire pH range between pH=1 and pH=11. The curve given in dashes corresponds to that of the product from Example 9

Zeta potential obtained: The solid curve is that corresponding to the product from Example 11 and it shows that the zeta potential is positive over the entire pH range between pH=1 and pH=10.7. The curve given in dashes corresponds to that of the colloidal $CeO_2$ dispersion of solution A, thus without addition of polymer.

Polish rates of blanket silicon dioxide and nitride films with 0.25% ceria slurry with and without cationic polymer as a function of pH (*polymer to ceria abrasive compound ratio (X) =0.8*)

Removal rates (RR) of blanket silicon dioxide and nitride films with ceria slurry with and without cationic polymer as a function of particle loading Polish rates of blanket silicon dioxide and silicon nitride films with 0.25% ceria (60 nm) slurry as a function of polymer: abrasive ratio (X) at pH 4

Polish rates of blanket silicon dioxide and silicon nitride films with 0.25% ceria (60 nm) slurry as a function of polymer: abrasive ratio (X) at pH 5

Polish rates of blanket silicon dioxide and nitride films with 0.25% ceria (25 nm) slurry as a function of polymer: abrasive ratio (X) at pH 4

Polish rates of blanket silicon dioxide and nitride films with 0.25% ceria (25 nm) slurry as a function of polymer: abrasive ratio (X) at pH 5

Frictional coefficient data for oxide and nitride films at pH 4 ($X$ = 0, 0.2 and 0.8)

Removal rate of oxide and nitride films polished with ceria (HC 60 (2+)) @ pH 4. Sample ID's and ceria to polymer ratio in the parenthesis are shown in x-axis.

Removal rate of oxide and nitride films polished with ceria (HC 60 (2+)) @ pH 5. Sample ID's and ceria to polymer ratio in the parenthesis are shown in x-axis.

Removal rate of oxide and nitride films polished with ceria (HC 25 (2+)) @ pH 4. Sample ID's and ceria to polymer ratio in the parenthesis are shown in x-axis.

Removal rate of oxide and nitride films polished with ceria (HC 25 (2+)) @ pH 5. Sample ID's and ceria to polymer ratio in the parenthesis are shown in x-axis.

Removal rate of oxide and nitride films polished with ceria (HC 60 (2+)) @ pH 4. Sample ID's and ceria to polymer ratio in the parenthesis are shown in x-axis.

Removal rates of nitride and oxide films polished at ph 3.5 and 4. The slurry contained 0.25wt% of ceria in DI water.

Blanket wafer removal rates of oxide and nitride films with Cabot slurry containing ceria of present invention.

Zeta potential of ceria ($d_{mean}$ ~60 nm) as a function of cationic polymer to abrasive ratio Zeta potential of silica ($d_{mean}$ ~50 nm) as a function of cationic polymer to abrasive ratio Zeta potential of silicon nitride($d_{mean}$ ~50 nm) as a function of cationic polymer to abrasive ratio Absorption spectra of ceria slurries with different concentrations of additive

ABRASIVE COMPOSITIONS FOR CHEMICAL MECHANICAL POLISHING AND METHODS FOR USING SAME

CROSS REFERENCE TO RELATED APPLICATIONS

This application claims the benefit of U.S. Provisional Application No. 61/194,497, filed on Sep. 26, 2008, herein incorporated by reference.

FIELD OF INVENTION

This invention relates to abrasive compositions and methods for use in polishing applications and, more particularly, to abrasive compositions and methods for use in chemical mechanical polishing processing of substrates.

BACKGROUND OF THE INVENTION

CMP ("Chemical Mechanical Planarization" or "Chemical Mechanical Polishing") processes are known in the art. CMP processes generally involve the removal of material from uneven topography on a substrate surface, typically a semiconductor-related substrate, until a planarized (i.e., flat) surface is created. The CMP process is used in connection with a polishing composition (or otherwise known as a sol or slurry) and polishing pad. The polishing composition typically contains abrasive particles dispersed in an alkaline solution or other liquid carrier. The polishing composition is applied to the substrate surface with the polishing pad, which is often saturated with the polishing composition. A rotating head presses the rotating substrate against the polishing pad to planarize or polish the substrate surface.

This CMP process combines a "mechanical" effect of smoothing with a abrasive particles with a "chemical" effect of etching with acidic or basic fluid solution. This provides greater accuracy in, for example, photolithography, allowing layers to be added with minimal and/or acceptable height variations.

In traditional CMP processes, a high silicon dioxide and a low silicon nitride removal rate are desired to minimize loss of the nitride film. The ratio of rate of removal of silicon dioxide to the rate of removal of silicon nitride is defined as "selectivity" or "selectivity ratio". In contrast, there are now certain applications where the reverse, i.e., a high nitride and a low oxide removal rate, is desirable. Such reverse applications, however, have been difficult to achieve. (The ratio of rate of removal of silicon nitride to the rate of removal of silicon dioxide is defined as "reverse selectivity" or "reverse selectivity ratio".)

The polishing compositions that contain dispersed abrasive particles in a liquid medium can also exhibit varying degrees of stability along a range of pH values, which can be established by measuring the zeta potential of the dispersion. The zeta potential indicates the degree of repulsion between same charged particles adjacent to one another in a dispersion. A colloid dispersion with a high zeta potential, either positive or negative, will confer stability, i.e. resist aggregation. A lower zeta potential will generally confer instability to the colloid dispersion where attraction exceeds repulsion, meaning the dispersion will tend to break and flocculate. Thus, colloids with high zeta potential (negative or positive) tend to be generally electrically stable while colloids with low zeta potential tend to aggregate or flocculate.

Accordingly, there is a need to provide an improved electrically stabilized polishing composition for use in CMP processes with high reverse selectivity, and methods thereof.

SUMMARY OF THE INVENTION

It has been found that a high reverse selectivity is difficult to achieve in CMP processes without extensive preparation of the abrasive particles and the use of costly additives. Without being bound by theory, it is believed that the removal of the nitride is a two step process, the first step being the hydrolysis of the nitride to $SiO_2$ (hereinafter silicon dioxide or, more generally, silicon oxide), followed by the removal of the oxide, with the hydrolysis being generally considered the rate determining step.

The present invention will become apparent from the following description and examples, which comprises, in one aspect, a colloidal dispersion for chemical mechanical polishing comprising (a) an abrasive component; and (b) from about 0.05% to about 10% by weight of the abrasive component, a water-soluble amphoteric polymer comprising at least one part B and at least one part A, wherein part B is cationic and part A is anionic; wherein the dispersion has a pH of between about 1.5 and about 6.

In one embodiment, part B is a macromolecular chain derived from one or more ethylenically unsaturated monomers having quaternary ammonium groups or inium groups, and part A is (i) bonded to a single end of the at least one macromolecular chain B and (ii) is a polymeric or nonpolymeric group comprising at least one anionic group In one embodiment, the dispersion is capable of polishing a substrate comprising silicon nitride and silicon oxide with a reverse selectivity ratio of at least about 27, more typically at least about 30, most typically at least about 50, where the reverse selectivity ratio is the ratio of the rate of removal of the silicon nitride to the rate of removal of the silicon oxide.

In one embodiment, the ethylenically unsaturated monomers can comprise trimethylammoniopropyl methacrylate chloride, trimethylammonioethylacrylamide, -methacrylamide chloride, -methacrylamide bromide, trimethylammoniobutylacrylamide, -methylacrylamide methyl sulphate, trimethylammoniopropylmethacrylamide methyl sulphate (MAPTA MeS), (3-methacrylamidopropyl)trimethylammonium chloride (MAPTAC), (3-acrylamidopropyl)trimethylammonium chloride (APTAC), methacryloyloxyethyltrimethylammonium chloride, methacryloyloxyethyltrimethylammonium chloride methyl sulphate, acryloyloxyethyltrimethylammonium salts (AD-AMQUAT), 1-ethyl-2-vinylpyridinium, 1-ethyl-4-vinylpyridinium bromide, 1-ethyl-2-vinylpyridinium, 1-ethyl-4-vinylpyridinium chloride, 1-ethyl-2-vinylpyridinium, 1-ethyl-4-vinylpyridinium methyl sulphate, N,N-dimethyldiallylammonium chloride (DADMAC), dimethylaminopropylmethacrylamide, N-(3-chloro-2-hydroxypropyl)trimethylammonium chloride (DIQUAT), a monomer of formula:

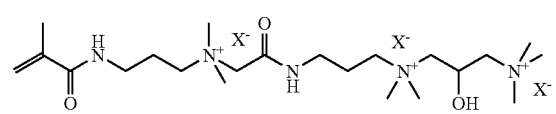

where $X^-$ is an anion, or a monomer of formula:

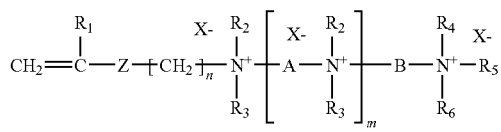

wherein $R_1$ is a hydrogen atom or a methyl or ethyl group; $R_2$, $R_3$, $R_4$, $R_5$ and $R_6$, which are identical or different, are linear or branched $C_1$-$C_6$, typically $C_1$-$C_4$, alkyl, hydroxyalkyl or aminoalkyl groups; m is an integer from 1 to 10, for example 1; n is an integer from 1 to 6, typically 2 to 4; Z represents a —C(O)O— or —C(O)NH— group or an oxygen atom; A represents a $(CH_2)_p$ group, p being an integer from 1 to 6, typically from 2 to 4; B represents a linear or branched $C_2$-$C_{12}$, advantageously $C_3$-$C_6$, polymethylene chain optionally interrupted by one or more heteroatoms or heterogroups, in particular O or NH, and optionally substituted by one or more hydroxyl or amino groups, typically hydroxyl groups; and X, which are identical or different, represent counterions, and their mixtures, and macromonomers deriving thereof.

In another embodiment, the abrasive component comprises particles selected from (a) an oxide, a hydroxide or an oxyhydroxide of cerium, titanium, silicon, zirconium, manganese, aluminium or iron; (b) a mixture of an oxide, a hydroxide or an oxyhydroxide of cerium with at least one other element chosen from rare earth metals or tin; or (c) a mixture of an oxide, a hydroxide or an oxyhydroxide of zirconium and of a trivalent rare earth metal. The abrasive component can comprise cerium oxide particles exhibiting a mean particle diameter of between about 10 nm and about 200 nm, typically between about 50 nm and about 60 nm and exhibiting a standard deviation value of at most 20% of the mean particle diameter.

In another embodiment, part A is a macromolecular chain comprising anionic groups, the macromolecular chain derived from anionic monomers chosen from acrylic acid, acrylic anhydride, methacrylic acid, methacrylic anhydride, maleic acid, maleic anhydride, fumaric acid, itaconic acid, N-methacryloylalanine, N-acryloylglycine and their water-soluble salts, 2-sulphooxyethyl methacrylate, vinylbenzenesulphonic acid, allylsulphonic acid, 2-acrylamido-2-methylpropanesulphonic acid, sulphoethyl acrylate or methacrylate, sulphopropyl acrylate or methacrylate, and their water-soluble salts, vinylphosphonic acid, ethylenically unsaturated phosphate esters or any combination thereof.

In yet another embodiment, part A is a chain end unit comprising at least one anionic group chosen from a carboxylate group, a sulphonate group, a sulphate group, a phosphonate group, a phosphate group or any combination thereof.

In another aspect, the invention is a method for chemical mechanical polishing of a substrate comprising: (a) contacting a substrate comprising a silicon nitride layer and a silicon oxide layer with a colloidal dispersion as fully described above, the dispersion generally comprising: (i) an abrasive component; and (ii) from about 0.3% to about 5% by weight of the abrasive component, a water-soluble amphoteric polymer comprising (aa) at least one part B comprising one or more cationic monomeric units and (bb) at least one part A comprising one or more anionic monomeric units; wherein the dispersion has a pH of between about 1.5 and about 6; and (b) performing a CMP process on the substrate.

In one embodiment, the at least one part B is at least one macromolecular chain B, wherein part A is bonded to a single end of the at least one macromolecular chain B, wherein the macromolecular chain B is derived from one or more ethylenically unsaturated monomers having quaternary ammonium groups or inium groups, and wherein part A is a polymeric or nonpolymeric group comprising at least one anionic group.

In one embodiment, the step of performing the CMP process on the substrate comprises: (a) positioning a polishing pad proximate or adjacent to the substrate such that (i) the dispersion is between the substrate and the polishing pad or (ii) the polishing pad is saturated with the dispersion; and (b) moving the polishing pad relative to the substrate, thereby planarizing the substrate. It is understood that the steps described herein do not have to be performed in any particular order, for example, the polishing pad can be positioned proximate or adjacent to the substrate prior to contacting the substrate with the dispersion. The substrate is polished at a reverse selectivity ratio of at least about 27, more typically at least about 30, most typically at least about 50, the reverse selectivity ratio being the ratio of the rate of removal of the silicon nitride layer to the rate of removal of the silicon oxide layer. In another embodiment, the substrate is polished at a reverse selectivity ratio of between about 30 and about 120.

In one embodiment, the amphoteric polymer is a telomere having a structure A-B, where A is a chain end unit comprising at least one anionic group. In another embodiment, the amphoteric polymer is a copolymer chosen from the following: (a) (block A)-(block B) diblock copolymer, the part A constituting the block A and the macromolecular chain B constituting the block B; (b) (block B)-(block A)-(block B) triblock copolymer, the part A constituting the block A and the macromolecular chain B constituting the block B; or (c) (backbone A)-(side chains B) comb copolymer, the part A constituting the backbone A and the comb copolymer comprising a plurality of macromolecular chains B each bonded to the backbone A at one of their ends.

In yet another aspect, the present invention is a method for chemical mechanical polishing of a substrate comprising: (a) contacting a substrate comprising a silicon nitride layer and a silicon oxide layer with a colloidal dispersion, the dispersion capable of hydrolyzing the silicon nitride layer thereby effectuating the hydrolyzed silicon nitride layer susceptible to mechanical removal, whereby the substrate is polished at a reverse selectivity ratio of at least about 27, the reverse selectivity ratio being the ratio of the rate of removal of the silicon nitride layer to the rate of removal of the silicon oxide layer; and (b) performing a CMP process on the substrate.

In one embodiment, the step of performing the CMP process on the substrate comprises (a) positioning a polishing pad proximate or adjacent to the substrate such that (i) the dispersion is between the substrate and the polishing pad or (ii) the polishing pad is saturated with the dispersion; and (b) moving the polishing pad relative to the substrate, thereby planarizing the substrate.

DETAILED DESCRIPTION

Figure 1:
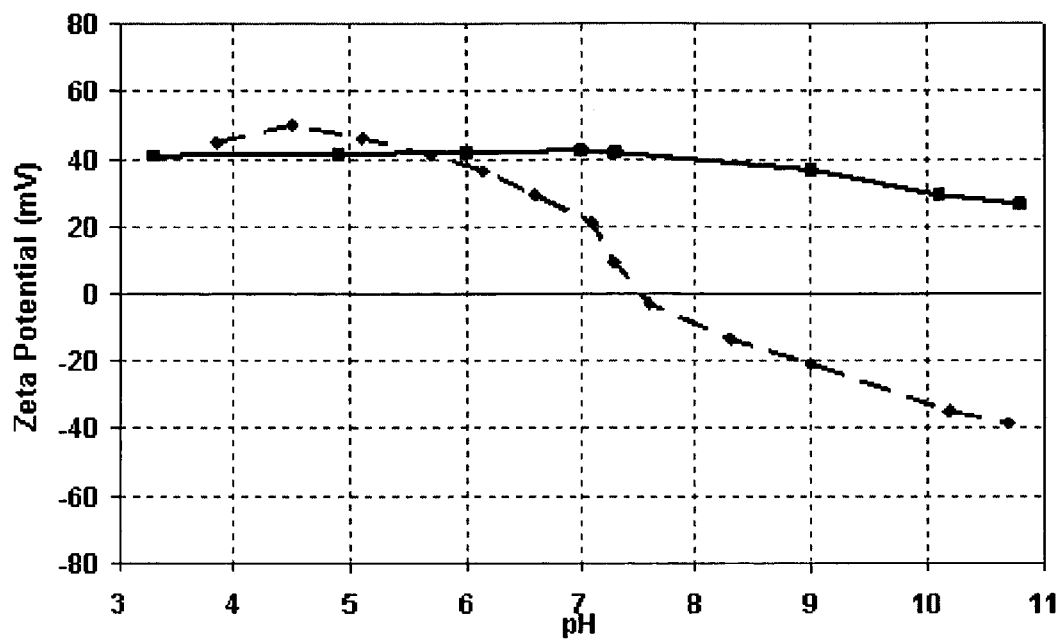
FIG. 1 illustrates zeta potential curves obtained for a product of the present invention and a product of the prior art.

The present invention relates to a colloidal dispersion of inorganic particles and a polymer in a liquid phase, and methods for using such dispersion in polishing processes. In one embodiment, the present invention comprises an abrasive component and an amphoteric polymer dispersed in solvent or water. The present invention is capable of improving reverse selectivity in polishing; reverse selectivity being the ratio of the rate of removal of silicon nitride to the rate of removal of silicon oxide. It is understood that the term "polishing" of a substrate herein is interchangeable with the term "planarization" of the substrate, as those terms are generally known in the art.

One of the traditional problems related to such colloidal dispersions is their stability, very particularly their stability as a function of pH. The dispersions having stability is understood to mean that the colloidal particles of which they are composed have to remain in suspension in the liquid phase without separation by settling occurring over a sufficient period of time for optimum use. In addition, dispersions are desired which are stable over a significant pH range which makes it possible to effectively use them in applications and under conditions which are as varied as possible. Without being bound by theory, it is believed that the particles in a dispersion exhibit a repulsive force profile that counteracts Van der Waals attraction among particles. This is provided by a charge developed at the solid-liquid interface (electrostatic stabilization) and/or the absorbed polymer on the particle surface (steric stabilization) or both.

Accordingly, the present invention comprises a dispersion with improved stability characteristics. The improved stability of the polishing composition of the present invention can be seen in the comparison of the zeta potential between the present invention and the prior art. As described herein, the zeta potential indicates the degree of repulsion between same charged particles adjacent to one another in a dispersion. A colloid dispersion that is measured with a high zeta potential, generally higher than ±15 mV, is indicative of a tendency towards stability, i.e. the dispersion tends to resist aggregation. A lower zeta potential is indicative of a tendency towards instability, i.e., where attraction exceeds the repulsion among the dispersed particles, meaning the dispersion will tend to break and flocculate.

Depending on the nature of the metal element employed, the dispersion of the present invention can be highly advantageous for applications in the field of catalysis, where they are used as a source of nanometric particles in the preparation of supported catalysts, or in the field of protection from UV radiation. The dispersions of the present invention are also advantageous in the field of the electronics industry, as described in greater detail below, where they can be used for the polishing of various components, such as semiconductor substrates or dielectric compounds.

In one embodiment, the present invention includes a method of polishing a semiconductor substrate. The semiconductor substrate comprises at least a silicon oxide layer and a silicon nitride layer. The silicon oxide or silicon oxide layer can be deposited on the underlying substrate by known methods including for example chemical vapor deposition. Other materials layers may also be present on the substrate. In the embodiment, the silicon nitride layer is polished until the polishing reaches the silicon oxide layer; polishing of the silicon nitride layer is terminated or substantially terminated when a level is exposed where both a layer of silicon nitride and silicon oxide coexist. Here, the silicon oxide layer becomes the polishing stopping layer instead of the conventional method where silicon nitride is the polishing stopping layer. The CMP process can be utilized in any suitable processing step in the manufacture of semiconductor devices, including but not limited to Damascene metal gate processing, shallow trench isolation (STI) processing and the like. In utilizing the polishing composition of the present invention (i.e., the colloidal dispersion for CMP), the reverse selectivity can be at least 20, more typically at least 27, still more typically at least 50.

The Abrasive Component

In one embodiment, the particles are initially present in the form of a sol, also known as a "slurry", of such particles dispersed in an aqueous medium. Typically, the aqueous medium comprises at least 40 wt %, more typically at least 50 wt % water and even more typically at least 60 wt % water. In one embodiment, the aqueous medium comprises at least 95 wt % water. In one embodiment, the aqueous medium consists essentially of water. The aqueous medium may optionally further comprise one or more water miscible organic liquids, such as for example, tetrahydrofuran, N,N-dimethylformamide, acetonitrile, acetone, ($C_1$-$C_8$) alkanols such as methanol, ethanol, 2-propanol and diols such as ethylene glycol, propylene glycol, ethylene glycol monoacetate, glycol ethers, polyols or ketones.

As used herein the terminology "primary particle" means a single discrete particles and the terminology "secondary particle" means an agglomerate of two or more primary particles. A reference to "particles" that does not specify "primary" or "secondary" means primary particles, or secondary particle, or primary particles and secondary particles.

In one embodiment, the abrasive component is comprised of particles having a mean particle diameter ("$D_{50}$") of from about 1 to about 1000 nanometers ("nm"). In one embodiment, the particles have a $D_{50}$ of from about 10 to about 150 nm, even more typically from about 20 to about 70 nm, and still more typically from about 25 to about 60 nm. In one embodiment, the particles have a $D_{50}$ of from about 1 to about 500 nm, even more typically from about 20 to about 70 nm, and still more typically from about 25 to about 60 nm. Particle size may be determined using dynamic light scattering. The sizes given here are measured by the technique of quazielastic light scattering (QELS) or by the laser diffraction technique. Alternatively, particle size can be determined by transmission electron microscopy (TEM)—on a sample dried beforehand on a carbon membrane supported on a copper grid and over a mean of 50 measurements.

These particles are in stable suspension in a liquid phase. This is understood to mean that, with regard to these dispersions, a cake formed by separation by settling is not observed to form before several days, for example at least 8 days. Furthermore, the cake formed by separating by settling, if it is formed, can be resuspended by simple agitation.

The particles can be comprised of inorganic oxides in one embodiment, inorganic hydroxides in another embodiment, an inorganic oxyhydroxide in another embodiment or any combination thereof yet another embodiment. Suitable particles include oxides, hydroxides and/or oxyhydroxides of single elements including but not limited to cerium, titanium, zirconium, silicon, aluminum, manganese, tin, iron, silica, and mixtures thereof, as well as of mixtures of such elements (e.g., cerium-zirconium oxides). Typically, the particles are comprised of an oxide, a hydroxide or an oxyhydroxide of cerium or zirconium, more typically an oxide of cerium.

In another embodiment, the particles can be a mixture of an oxide, a hydroxide or an oxyhydroxide of cerium with at least one other element chosen from rare earth metals (including but not limited to lanthanum, praseodymium, neodymium) or tin. The term "rare earth metal" is understood to mean the elements from the group consisting of yttrium and the elements of the Periodic Table of the Elements with an atomic number of between 57 and 71 inclusive. In another embodiment, the particles can be a mixture of an oxide, a hydroxide or an oxyhydroxide of zirconium and of a trivalent rare earth metal. The term "trivalent rare earth metal" is understood to mean, unless otherwise indicated, a rare earth metal which can exist only in the trivalent form.

In another embodiment, the inorganic particles are based on an inorganic oxide which can be chosen from $CeO_2$, $TiO_2$, $ZrO_2$, $Al_2O_3$ or $Fe_2O_3$. The particles can also be based on a hydroxide and/or on an oxyhydroxide of the same above metal elements. For the continuation of the description in this section A, the term "oxide", in the singular or in the plural, should be understood as applying not only to the oxide form but also to the "hydroxide" and "oxyhydroxide" forms. The particles can also be based on a mixture of the oxides mentioned above. Furthermore, the particles can also be based on a mixture of cerium oxide with at least one other element chosen from rare earth metals or tin or also on a mixture of zirconium oxide and of a trivalent rare earth metal, the rare earth metal elements and tin generally being present in the oxide form. The invention applies not only to the case described above, where the particles are composed of a mixture of oxides, but also to the case where the dispersion comprises particles of a first type of oxide as a mixture with particles of another type of oxide.

The particles may further comprise linked or absorbed ions, such as, for example, metal ions, nitrate ions, acetates, chlorides or ammonium. It should be noted that, in such dispersions, the particles may occur either completely in the form of colloids or simultaneously in the form of ions or of polyions and in the form of colloids.

Methods for making suitable particles including oxides and hydrated oxides are generally known, such as sol-gel techniques, direct hydrolysis of metal alkoxides by water addition, forced hydrolysis of metal salts or by reaction of metal alkoxides with metal halides. In one embodiment, the particles are made by precipitation of a cerium salt.

In one embodiment, the aqueous medium of the sol comprises, based on 100 parts by weight ("pbw") of such aqueous medium, from about 0 to about 100 pbw, more typically from about 40 to about 100 pbw, and still more typically from about 50 to about 100 pbw water, and from 0 to about 90 pbw, more typically from 0 to about 60 pbw, and still more typically from about 0 to about 50 pbw, of one or more water miscible organic liquids.

The sol exhibits, at least initially, a pH effective to provide a stable sol, that is, a sol wherein the particles tend to remain dispersed in the aqueous medium. In one embodiment, the slurry is a stable slurry that comprises cerium oxide particles and exhibits a pH of between about 1.5 and about 6. The slurry is prepared in solution and pH was adjusted using any suitable buffer, including but not limited to $HNO_3$ or $NH_4OH$ One Embodiment Related to Inorganic Particles of the Present Invention In one first specific embodiment, the colloidal particles are particles of a compound of cerium and of at least one other element M chosen from zirconium, rare earth metals (Ln) other than cerium, titanium and tin and this compound is in the form of a mixed oxide in which the cerium and the element M are in pure solid solution, the compound comprising cerium in the form cerium(III) in an amount, expressed as cerium(III)/total cerium atomic ratio, of between 0.005 and 0.06. These particles exhibit a size which generally lies between 1 nm and 100 nm, more particularly between 2 nm and 50 nm.

The compound in this embodiment is in the form of a mixed oxide $(Ce,M)O_2$ in which the cerium and the element M are in solid solution. This is understood to mean that one of the elements, generally the element M, is completely or substantially incorporated in the crystal lattice of the oxide of the other matrix-forming element, for example cerium. This incorporation can be demonstrated by the X-ray diffraction technique on colloids after washing, in particular by ultrafiltration or also by ultracentrifuging, and drying at a temperature of 60° C. The X-ray diagrams reveal the presence of a crystalline structure corresponding to the oxide of the matrix-forming element (generally cerium oxide) and having unit cell parameters more or less offset with respect to a pure oxide of this first matrix-forming element, which demonstrates the incorporation of the other element in the crystal lattice of the oxide of the first. For example, in the case of a solid solution of the element M in cerium oxide, the X-ray diagrams then reveal a crystalline structure of fluorite type, just like crystalline ceric oxide $CeO_2$, the unit cell parameters of which are more or less offset with respect to a pure ceric oxide, thus reflecting the incorporation of the element M in the crystal lattice of the cerium oxide.

In one embodiment, the solid solution is pure, that is to say that, for the colloidal particles, the total amount of one element is in solid solution in the other, for example all the element M in solid solution in the cerium oxide. In this case, the X-ray diagrams show only the presence of the solid solution and do not comprise lines corresponding to an oxide of the type of oxide of the element other than the matrix-forming element, for example an oxide of the element M.

The amount of cerium(III), expressed by the cerium(III)/total cerium atomic ratio, is between 0.005 and 0.06. More typically, this amount can be between 0.005 and 0.05 and most typically between 0.005 and 0.03. It is understood that Cerium(III) can be present in the compound as a cation, which can be in the form adsorbed at the surface of the particles of the cerium compound, in the crystal unit cell of the compound, or a combination of both.

The presence of cerium(III) in solution can be demonstrated by chemical quantitative determination. Use may thus be made of a technique for analysis by potentiometric assaying by oxidation of cerium(III) to give cerium(IV) using potassium ferricyanide in potassium carbonate medium. The presence of cerium(III) at the surface of the particles can be demonstrated by the determination of the isoelectric point of the colloidal dispersions. This determination is carried out in a known way by measuring the variation in the zeta potential of the dispersions. When the variation in this potential is measured, by varying the pH of a dispersion from an acidic value to a basic value, this potential changes from a positive value to a negative value, the transition at the zero value of the potential constituting the isoelectric point. The presence of cerium(III) at the surface increases the value of the isoelectric point with respect to a compound comprising only cerium (IV). It should be noted that the measurement method which has just been described applies to a dispersion in the absence of the copolymer, for example to a starting dispersion which will be used to obtain a dispersion according to the invention in the process for the preparation of the dispersion, which process will be described later.

Element M will now be described in more detail. Generally, the various formulae given below are determined by chemical analyses on colloids recovered either by ultracentrifuging at 50 000 rev/min for 6 hours or after washing the dispersions, the washing being carried out by ultra-filtration or by dialysis with at least 10 equivalent volumes of water (1 volume of dispersion:10 volumes of water).

In one embodiment, element M is zirconium. More particularly, in this embodiment, the compound corresponds to the formula (1) $Ce_{1-x}Zr_xO_2$ where x is less than 1 and is at least equal to 0.01, more typically at least equal to 0.02. In another embodiment, the element M is a combination of zirconium and tin. Alternatively, in this embodiment the compound can correspond to the following formula (2) $Ce_{1-x-y}Zr_xSn_yO_2$ in which x+y<1, where $0.05 \leq x \leq 0.95$ and where y is at least equal to 0.01, the high value of y being chosen such that a solid solution can be obtained. Typically, x adheres to the condition $0.20 \leq x \leq 0.8$ and more typically the condition $0.40 \leq x \leq 0.60$. In one embodiment, y is at least equal to 0.05 and more typically y is at least equal to 0.2. More typically, y is at most equal to 0.4 and more typically at most equal to 0.25.

In another embodiment, the element M is a combination of zirconium and at least one rare earth metal Ln, more particularly a trivalent rare earth metal. The rare earth metal can be in particular lanthanum, gadolinium, terbium, praseodymium or neodymium. Typically, the compound corresponds to the formula (3) $Ce_{1-x-y}Zr_xLn_yO_2$ in which x+y<1, x adheres to the condition $0.05 \leq x \leq 0.95$ and y is at least equal to 0.01, the high value of y being chosen so that a solid solution is indeed obtained. Typically, x adheres to the condition $0.20 \leq x \leq 0.08$ and more typically the condition $0.40 \leq x \leq 0.60$. Typically, y is at least equal to 0.02 and more typically y is at least equal to 0.04. In one embodiment, y is at most equal to 0.07, typically at most equal to 0.05 and more typically at most equal to 0.03. The element M can also be a combination of at least two rare earth metals, at least one of which is praseodymium. Finally, it may be noted that, in the case where M is terbium or praseodymium, optionally in combination with another rare earth metal, these elements can be present both in the Tb(III) and Pr(III) forms and the Tb(IV) and Pr(IV) forms.

In yet a further embodiment, the element M is a combination of zirconium, of tin and of at least one rare earth metal Ln. In this embodiment, the rare earth metal can be a trivalent rare earth metal, and the rare earth metal can in particular be lanthanum, gadolinium, terbium, praseodymium or neodymium. More particularly, the compound can correspond to formula (4) $Ce_{1-x-y-z}Zr_xSn_yLn_zO_2$ in which x+y+z<1, x adheres to the condition $0.05 \leq x \leq 0.95$, y is at least equal to 0.01 and z is at least equal to 0.01. Typically, x adheres to the condition $0.20 \leq x \leq 0.8$ and y is at least equal to 0.10 and more typically x adheres to the condition $0.40 \leq x \leq 0.60$ and y is at least equal to 0.2. The high values of y and z are chosen so that a solid solution is obtained. More typically, y is at most equal to 0.4 and even more typically at most equal to 0.25; furthermore, z is typically at most equal to 0.05 and more typically at most equal to 0.03.

In one embodiment, M comprises a rare earth metal or a combination of rare earth metals, typically, where one of the rare earth metals is a trivalent rare earth metal. The rare earth metal can in particular be lanthanum, gadolinium, terbium, praseodymium or neodymium. The compound can correspond to the following formula (5) $Ce_{1-x}Ln_xO_2$ in which x is at most equal to 0.15 and is at least equal to 0.01, typically at least equal to 0.02 and more typically at least equal to 0.04. In one embodiment, x is at most equal to 0.10 and more typically at most equal to 0.05. The rare earth metal can be present, at least in part, in the Ln(III) form and either in the crystal unit cell or in the form adsorbed at the surface of the particles of the cerium compound. In the case of praseodymium, the latter element can be present both in the Pr(III) and Pr(IV) forms and x is at least equal to 0.04, more typically between 0.03 and 0.08.

In another embodiment, the compound is a mixed oxide of formula (6) $Ce_{1-x}Ti_xO_2$ in which x is at most equal to 0.6 and is at least equal to 0.01, typically at least equal to 0.05 and more typically at least equal to 0.2. In one embodiment, x is at most equal to 0.5.

Embodiment Related to the Inorganic Particles of the Present Invention

In one embodiment, the inorganic particles are cerium oxide particles, these particles (secondary particles) exhibit a mean size of at most 200 nm, these secondary particles being composed of primary particles having sizes exhibiting a mean value of at most 100 nm with a standard deviation having a value of at most 30% of the said mean size.

The particles of which the dispersion according to this second embodiment is composed and which exhibit a mean size of at most 200 nm are referred to, in the continuation of the description relating to this second form, as "secondary particles". These particles are aggregates of other finer aggregated particles, subsequently referred to as "primary particles".

According to an advantageous characteristic, these primary particles are fine and monodispersed. Specifically, they exhibit a mean size of at most 100 nm with a standard deviation having a value of at most 30%, more particularly of at most 20%, of the said mean size.

The mean value of the size of the primary particles is determined by the X-ray diffraction (XRD) technique. The value measured by XRD corresponds to the size of the coherent domain calculated from the width of the two most intense diffraction lines using the Scherrer model. This value can also be determined by the measurement of the BET surface.

The standard deviation mentioned here has the usual mathematical meaning; it is the square root of the variants and is expressed by the formula:

$$\sigma = \sqrt{\frac{1}{n}\sum_{i=1}^{n}(x_i - \bar{x})^2}$$

n being the number of particles taken into account in the measurement, $x_i$ being the size of a particle i, $\bar{x}$ being the mean value of the size of the particles ($1/n\Sigma_i x_i$). The size of the n different particles is measured from a photograph obtained by transmission electron microscopy (TEM).

This standard deviation can more particularly be at most 15% and more particularly still at most 10% of the value of the mean particle size. The primary particles can have sizes which exhibit a mean value of at most 95 nm, more typically of at most 60 nm.

These mean sizes of primary particles can furthermore be at least 10 nm, in particular at least 20 nm and more particularly at least 30 nm. According to specific alternative forms, these mean sizes can thus be between 10 nm and 100 nm, 20 nm and 80 nm, and 30 nm and 60 nm.

As indicated above, these primary particles can form aggregates which constitute the secondary particles. These secondary particles can more particularly have a mean size of at most 150 nm, more particularly of at most 100 nm. These secondary particles can themselves be monodispersed. Specifically, they can exhibit a dispersion index of at most 0.5. This index can typically be at most 0.4 and more typically at most 0.3. The mean size and the dispersion index of secondary particles can be obtained by employing the laser diffraction technique using a laser particle sizer (distribution by weight).

The term "dispersion index" is understood to mean the ratio:

$$\sigma/m = (d_{90} - d_{10})/2d_{50}$$

in which: $d_{90}$ is the size or diameter of the particles for which 90% of the particles have a diameter of less than $d_{90}$; $d_{10}$ is the size or diameter of the particles for which 10% of the particles have a diameter of less than $d_{10}$; $d_{50}$ is the mean size or diameter of the particles.

The liquid phase of the dispersions according to this second embodiment can be water. This can also be a water/water-miscible solvent mixture. Mention may be made, as example solvent of this type, of alcohols, such as methanol or ethanol, glycols, such as ethylene glycol, alkyl derivatives or acetates of the glycols, such as ethylene glycol monoacetate, or polyols.

Processes for the preparation of the dispersion according to this particular embodiment will now be described.

The dispersion can be prepared by a first process which comprises the following stages:

(a) a solution of a cerium(III) salt which additionally comprises cerium(IV) is prepared; (b) this solution is brought into contact under an inert atmosphere with a base, whereby a precipitate is obtained; (c) the medium obtained in the preceding stage is subjected to a heat treatment under an inert atmosphere, at least one of stages (a), (b) or (c) being carried out in the presence of nitrate ions; (d) the medium thus obtained is successively, but in any order, acidified and washed, whereby the dispersion is obtained.

The first stage (a) of the above process consists in preparing a starting solution which is a solution of a cerium(III) salt. Use may also be made of cerium(III) nitrate, chloride, sulphate or carbonate, and also mixtures of these salts, such as nitrate/chloride mixtures. This starting solution should exhibit the appropriate acidity in order for the cerium to be indeed entirely present in solution. The starting solution additionally comprises cerium(IV). The cerium(IV) is contributed by a salt. This can, for example, be cerium(IV) nitrate. Generally, the amount of cerium(IV) is such that the (Ce(IV)/Ce(III)) molar ratio in the starting solution is between 1/5000 and 1/50.

The starting solution prepared in stage (a) can be degassed beforehand by bubbling with an inert gas. The term "inert gas" or "inert atmosphere" is understood to mean, for the present description, an atmosphere or a gas completely or substantially devoid of oxygen. There, in some instances, can be trace amounts of oxygen in the atmosphere or gas due to for example the presence of oxygen trapped in the solution. It is possible for the gas to be, for example, nitrogen or argon.

The second stage (b) of the process consists in reacting the starting solution with a base. Use may be made, as base, of products of the hydroxide type. The base includes but is not limited to alkali metals or alkaline earth metal hydroxides and aqueous ammonia. Use may also be made of secondary, tertiary or quaternary amines. However, amines and aqueous ammonia may utilized in so far as they reduce the risks of contamination by alkali metal or alkaline earth metal cations.

The base can also be degassed beforehand by bubbling with an inert gas. In order to carry out the reaction of the second stage of the process, the operation of bringing into contact can be carried out in any order of introduction of the reactants. However, it is typical to introduce the starting solution into a medium comprising the base.

This second stage should be carried out under an inert atmosphere, either in a closed reactor or in a semi-closed reactor with flushing by the inert gas. The operation of bringing into contact is generally carried out in a stirred reactor. Finally, this second stage is generally carried out at ambient temperature (20° C.-25° C.) or at a temperature of at most 50° C.

The third stage (c) of the process is a heat treatment of the reaction medium obtained on conclusion of the preceding stage. This treatment consists of heating the medium and maintaining it at a temperature which is generally at most 95° C. and more particularly between 60° C. and 95° C.

The duration of this treatment can be between a few minutes and a few hours. This treatment is also carried out under an inert atmosphere, that which was described in the subject of this atmosphere for the second stage likewise applying here.

According to one characteristic of the process, at least one of stages (a), (b) or (c) has to be carried out in the presence of nitrate ions. Generally, the nitrate ions are introduced by the addition of nitric acid, more particularly in stage (a), during the preparation of the cerium(III) solution. The amount of nitrate ions, expressed by the $NO_3^+/Ce^{3+}$ molar ratio, is generally between 1/3 and 5.

The final stage of the process, stage (d), in fact comprises two successive operations which can be carried out in any order. These operations comprise an acidification process and a washing operation. These operations will be described in more detail below.

The acidification generally takes place by addition of an acid, after cooling the medium obtained on conclusion of stage (c). Use may be made of any inorganic or organic acid. Use is more particularly made of nitric acid. The amount of acid added is such that the pH of the medium after acidification is between 2 and 5.

This operation is typically carried out under regular atmospheric conditions (i.e., not necessary to operate under an inert atmosphere at this phase of the process), although the operation can still be carried out an inert atmosphere. Acidification is typically followed by a washing operation, the purpose of which is to remove soluble entities such as essentially salts as the like from the dispersion.

The washing operation can be carried out in various ways, with or without solid/liquid separation. This operation can thus be carried out by separating the solid particles from the liquid phase, for example by frontal filtration, separating by settling or centrifuging. Typically, the solid obtained is subsequently redispersed in an aqueous phase. Tangential filtration can also be carried out.

The washing operation can be repeated, if necessary, for example until a given conductivity of the dispersion is obtained, the conductivity measuring the level of impurities present in this dispersion. As indicated above, the order of the operations can be reversed with respect to that which has just been described. Thus, on conclusion of stage (c) the washing operation can then be carried out in the way described above and, upon conclusion of the washing operation, the medium obtained can be subsequently acidified.

Upon conclusion of stage (d), a dispersion according is obtained. In the case of a dispersion in a water-miscible solvent medium, this dispersion can be prepared in a way known per se starting from an aqueous dispersion as obtained by the process which has just been described and by bringing it into contact with the solvent.

The operation of bringing into contact can be carried out at ambient temperature, for example approximately 20° C., but also at a higher temperature, for example within a range extending from 60° C. to 150° C.

An alternative process will now be described, with respect to the stage (a). This alternative process differs from the aforementioned process solely in stage (a), the remaining stages being the same. This stage (a) in the alternative process consists of preparing a solution of a cerium(III) salt which additionally comprises aqueous hydrogen peroxide solution. The nature of the cerium(III) salt is similar to that described above.

The amount of $H_2O_2$ solution is such that the ($H_2O_2$/Ce (III)) molar ratio in the cerium salt solution is between 1/10000 and 1/100. The solution prepared by the alternative process with respect to stage (a), is then brought into contact with a base under an inert atmosphere, a heat treatment is carried out under an inert atmosphere and the medium thus obtained is acidified and washed (i.e., identical or similar operations as with stages (b), (c) and (d) as described above with presence of nitrate ions in at least one of stages (a) (b) and (c)).

Polymer

Figure 2:
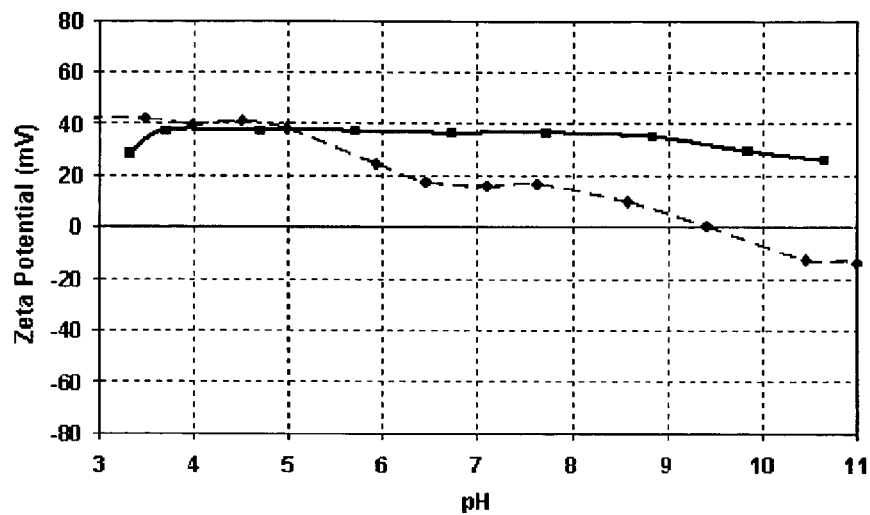
FIG. 2 illustrates zeta potential curves obtained for another product of the invention and a product of the prior art.

Other characteristics, details and advantages of the invention will become even more fully apparent on reading the description which will follow, made with reference to the appended drawings, in which: FIG. 1 gives zeta potential curves obtained for a product of the invention and a product of the prior art; and FIG. 2 gives zeta potential curves obtained for another product of the invention and a product of the prior art.

The term "specific surface" is understood to mean the B.E.T. specific surface determined by nitrogen adsorption in accordance with Standard ASTM D 3663-78 drawn up from the Brunauer-Emmett-Teller method. The term "monomeric unit" is understood to mean the largest constitutional unit contributed by a single monomer molecule to the structure of a macromolecule or oligomer molecule.

The term "anionic units" or "anionic monomeric units" are understood to mean monomeric units of the polymer which comprise an anionic or potentially anionic group. Anionic groups are groups which exhibit at least one negative charge (generally in combination with one or more cations, such as cations of alkali metals or alkaline earth metals, for example sodium, or with one or more cationic compounds, such as ammonium), whatever the pH of the medium in which the copolymer is present. Potentially anionic groups are groups which can be neutral or can exhibit at least one negative charge, depending on the pH of the medium in which the copolymer is present. Groups regarded as anionic are typically strong acid groups, for example with a pKa of less than or equal to 2. Groups regarded as potentially anionic are typically weak acid groups, for example with a pKa of greater than 2.

The term "cationic units" or "cationic monomeric units" are understood to mean monomeric units which comprise a cationic group and/or which have been categorized as such. Cationic groups are groups which exhibit at least one positive charge (generally in combination with one or more anions, such as the chloride ion, the bromide ion, a sulphate group or a methyl sulphate group), whatever the pH of the medium into which the copolymer is introduced.

The term "neutral units" or "neutral monomeric units" are understood to mean monomeric units which comprise substituent groups that do not exhibit a charge, whatever the pH of the medium in which the copolymer is present.

In the present patent application, "different composition(s) formed of monomers" can denote a composition for which the nature of the monomer or monomers and/or for which their proportions of different monomers are different. It is the same, by analogy, for a different macromolecular chain or a different composition formed of units. A composition formed of monomers comprising 100% of a monomer $M^1$ is different from a composition comprising 100% of a monomer $M^2$. A composition formed of monomers comprising 50% of a monomer $M^1$ and 50% of a monomer $A^1$ is different from a composition comprising 10% of the monomer $M^1$ and 90% of the monomer $A^1$. A composition formed of monomers comprising 50% of a monomer $M^1$ and 50% of a monomer $A^1$ is different from a composition comprising 50% of the monomer $M^1$ and 50% of the monomer $A^2$.

In the present patent application, an "ethylenically unsaturated" monomer means a compound comprising a polymerizable carbon-carbon double bond. It can be a monoethylenically unsaturated monomer, typically an α-monoethylenically unsaturated monomer, or a polyethylenically unsaturated monomer. In the present patent application, for the compounds other than star copolymers and for processes other than processes for the preparation of star copolymers, an ethylenically unsaturated monomer denotes a monoethylenically unsaturated monomer, typically an α-monoethylenically unsaturated monomer.

In one particular embodiment, the polymer is an amphoteric polymer that comprises one or more copolymers that comprises an anionic part A and a cationic part B. In one embodiment, the polymer comprises one or more polycationic copolymers, each of which is a copolymer comprising cationic monomeric units, each of which bears at least one cationic substituent group, and one or more polyanionic copolymers, each of which is a copolymer comprising anionic monomeric units, each of which bears at least one anionic substituent group. As stated above, it is understood that anionic part A can correlate to an anionic substituent group or to a potentially anionic substituent group.

In one embodiment, part A is a nonpolymeric group. In this embodiment, the part A can in particular be a unit at the chain end (at the end of the macromolecular chain B—wherein macromolecular chain B comprises cationic units derived from cationic monomers) comprising an anionic or potentially anionic group. In this embodiment, the amphoteric copolymer can be referred to as an amphoteric "telomer". Telomeric structures are generally known to a person skilled in the art; some, and methods of preparation, are described in detail below. The copolymer can thus be a telomer with the structure A-B, where A is a chain end unit comprising at least one anionic or potentially anionic group.

According to another embodiment, part A is a polymeric group. It can be a macromolecular chain A which is typically a linear (in contrast to a branched and/or star-shaped and/or crosslinked chain) comprising anionic monomeric units, each of which bears at least one anionic substituent group. The macromolecular chains A and B can be bonded to one another via a carbon-carbon bond or via another type of bond. It is also understood that in an alternative embodiment, part B can be nonpolymeric, where part A is polymeric. In such an embodiment, part B can be a unit at the chain end of macromolecular chain A, and the amphoteric copolymer is likewise referred to as an amphoteric telomere. The copolymer can thus be a telomer with the structure B-A, where B is a chain end unit comprising at least one cationic group.

In one embodiment, where part A is a polymeric group, the copolymer exhibits a plurality, typically at least 3, of macromolecular chains B which are bonded to the single macromolecular chain A, which macromolecular chain A is bonded at branching points which are not situated at the end of the macromolecular chain A. In this embodiment, the amphoteric copolymer can be a comb copolymer (backbone A)-(side chains B), part A constituting the backbone A and the copolymer comprising a plurality of macromolecular chains B each bonded to the backbone A at one of their ends. Alternatively, the amphoteric copolymer can be a comb copolymer (backbone B)-(side chains A), part B constituting the backbone B and the copolymer comprising a plurality of macromolecular chains A each bonded to the backbone B at one of their ends.

In one embodiment, the copolymer can exhibit one or two macomolecular chains B which are bonded to the macromolecular chain A at one or both of the ends of the latter. The macromolecular chain B can be likened to a "block B" and the macromolecular chain A can be likened to a "block A". The amphoteric copolymer can be referred to as an amphoteric "block copolymer". Typically, the macromolecular chains A and B are bonded to one another via a carbon-carbon bond. The amphoteric copolymer can in particular be chosen from the following copolymers: (i) (block A)-(block B) diblock copolymer, part A constituting the block A and the macromolecular chain B constituting the block B, and (ii) (block B)-(block A)-(block B) triblock copolymer, part A constituting the block A and the macromolecular chain B constituting the block B. In another embodiment, the copolymer is a linear diblock or triblock copolymer, of which block A and/or the block B is/are derived from ethylenically unsaturated monomers, typically from mono-α-ethylenically unsaturated monomers, and/or from monomers of copolymerizable diallyl type, such as N,N-dimethyldiallylammonium chloride (DADMAC).

Part A of the copolymer can be defined by the repeating units it comprises. A part may be defined by naming a polymer, or by naming monomers it is derived from. A unit deriving from a monomer is understood as a unit that may be directly obtained from the said monomer by polymerizing. Part A may be a copolymer, comprising several kind of repeating units, deriving from several monomers. Hence, part A and part B are different polymers, deriving from different monomers, but they may comprise some common repeating units (copolymers). Part A and part B typically do not comprise more than 50% of a common repeating unit (derived from the same monomer).

Suitable copolymer are described in US published application 2005/0176863 and in U.S. application Ser. No. 11/445, 115 filed on Jan. 6, 2006, U.S. Pat. No. 6,933,340, both applications and patent also incorporated by reference herein.

In one embodiment, part B of the copolymer is polycationic and comprises monomeric units derived from cationic monomers. Typical cationic monomers comprise an ammonium group of formula —NR3+, wherein R, which is identical or different, represents a hydrogen atom, an alkyl group comprising 1 to 10 carbon atoms, or a benzyl group, optionally carrying a hydroxyl group. Typically, the ammonium group is a quaternary ammonium group and, more typically, a trimethylammonium group. Cationic monomers can also comprise an inium group of formula $=N^+R_2$ wherein R, which is identical or different, represents a group other than the hydrogen atom, and can form part of an aromatic ring connected to the double bond, and wherein at least one of the R groups can be an optionally substituted hydrocarbon group, for example a linear or branched $C_1$-$C_{22}$ alkyl group, for example a methyl group. Typically, the inium group is a pyridinium group, an alkylpyridinium group, or a methylpyridinium group. Both of the aforementioned cationic monomers may comprise an anion (counter-ion). Examples of anions are halides such as chloride and bromides, sulphates, hydrosulphates, alkylsulphates (for example comprising 1 to 6 carbon atoms), phosphates, citrates, formates, and acetates.

Suitable cationic monomers include, for example: aminoalkyl (meth)acrylates, aminoalkyl (meth)acrylamides, monomers, including particularly (meth)acrylates, and (meth)acrylamides derivatives, comprising at least one secondary, tertiary or quaternary amine function, or a heterocyclic group containing a nitrogen atom, vinylamine or ethylenimine; diallyldialkyl ammonium salts; and their mixtures, their salts, and macromonomers deriving from therefrom.

Specific examples of cationic monomers include: dimethylaminoethyl (meth)acrylate; dimethylaminopropyl (meth)acrylate; ditertiobutylaminoethyl (meth)acrylate; dimethylaminomethyl (meth)acrylamide; dimethylaminopropyl (meth)acrylamide; ethylenimine; vinylamine; 2-vinylpyridine; 4-vinylpyridine; trimethylammonium ethyl (meth)acrylate chloride; trimethylammoniumethyl (meth)acrylate methyl sulphate; dimethylammonium ethyl (meth)acrylate benzyl chloride; 4-benzoylbenzyl dimethylammonium ethyl acrylate chloride; trimethyl ammonium ethyl (meth)acrylamido (also called 2-(acryloxy)ethyltrimethylammonium, TMAEAMS, or Padamquat) chloride; trimethylammonium ethyl (meth)acrylate (also called 2-(acryloxy)ethyltrimethylammonium, TMAEAMS, or Padamquat) methyl sulphate; trimethyl ammonium propyl (meth)acrylamido chloride; vinylbenzyl trimethyl ammonium chloride; diallyldimethyl ammonium chloride; 1-ethyl-2-vinylpyridinium or 1-ethyl-4-vinylpyridinium bromide, chloride or methyl sulphate;

N,N-dimethyldiallylammonium chloride (DADMAC); N-(3-chloro-2-hydroxypropyl)trimethylammonium chloride (DIQUAT); monomers having the following formula:

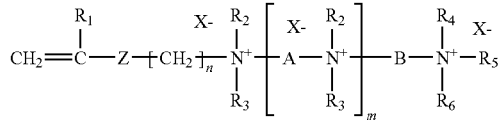

wherein $R_1$ is a hydrogen atom or a methyl or ethyl group; $R_2$, $R_3$, $R_4$, $R_5$ and $R_6$, which are identical or different, are linear or branched $C_1$-$C_6$, typically $C_1$-$C_4$, alkyl, hydroxyalkyl or aminoalkyl groups; m is an integer from 1 to 10, for example 1; n is an integer from 1 to 6, typically 2 to 4; Z represents a —C(O)O— or —C(O)NH— group or an oxygen atom; A represents a $(CH_2)_p$ group, p being an integer from 1 to 6, typically from 2 to 4; B represents a linear or branched $C_2$-$C_{12}$, advantageously $C_3$-$C_6$, polymethylene chain optionally interrupted by one or more heteroatoms or heterogroups, in particular O or NH, and optionally substituted by one or more hydroxyl or amino groups, typically hydroxyl groups; and X, which are identical or different, represent counterions, and their mixtures, and macromonomers deriving thereof, or monomers of formula:

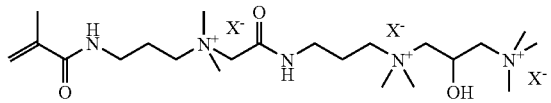

where $X^-$ is an anion.

In one embodiment, part A of the copolymer is polyanionic and comprises monomeric units deriving from anionic monomers. Suitable anionic monomers include, for example: alpha-ethylenically-unsaturated monomers comprising a phosphate or phosphonate group; alpha-ethylenically-unsaturated monocarboxylic acids; monoalkylesters of alpha-ethylenically-unsaturated dicarboxylic acids; monoalkylamides of alpha-ethylenically-unsaturated dicarboxylic acids; alpha-ethylenically-unsaturated compounds comprising a sulphonic acid group, and salts of alpha-ethylenically-unsaturated compounds comprising a sulphonic acid group.

In one embodiment, the anionic monomeric units of the polymer are derived from one or more anionic monomer selected from acrylic acid; methacrylic acid; salts of acrylic acid; salts of methacrylic acid; vinyl sulphonic acid; salts of vinyl sulphonic acid; vinylbenzene sulphonic acid; salts of vinylbenzene sulphonic acid; alpha-acrylamidomethylpropanesulphonic acid; salts of alpha-acrylamidomethylpropanesulphonic acid; 2-sulphoethyl methacrylate; salts of 2-sulphoethyl methacrylate; acrylamido-2-methylpropanesulphonic acid (AMPS); salts of acrylamido-2-methylpropanesulphonic acid; and styrenesulfonate (SS) and salts of SS.

The macromolecular chain A or macromolecular chain B can comprise monomer units other than that derived from anionic or cationic groups. They can in particular be neutral in pH conditions of the formulation and comprise monomeric units deriving from neutral monomers that remain neutral whatever the pH. Suitable neutral monomers include, for example, alkyl oxides, such as ethylene oxide, and propylene oxide;

acrylamide, methacrylamide;

amides of alpha-ethylenically-unsaturated, typically mono-alpha-ethylenically-unsaturated, monocarboxylic acids;

esters of an alpha-ethylenically-unsaturated, typically mono-alpha-ethylenically-unsaturated, monocarboxylic acid, for example alkyl esters such as such as methylacrylate, ethylacrylate, n-propylacrylate, n-butylacrylate, methylmethacrylate, ethylmethacrylate, n-propylmethacrylate, n-butylmethacrylate, 2-ethyl-hexyl acrylate, or hydroxyalkyl esters such as 2-hydroxyethylacrylate;

polyethylene and/or polypropylene oxide (meth)acrylates (i.e. polyethoxylated and/or polypropoxylated (meth)acrylic acid);

vinyl alcohol;

vinyl pyrrolidone;

vinyl acetate;

vinyl versatate;

vinyl nitriles, typically comprising from 3 to 12 carbon atoms, acrylonitrile;

vinylamine amides;

vinyl aromatic compounds, such as styrene, and mixtures thereof.

In one embodiment, the polymer comprises a polycationic homopolymer, such as, for example, a poly(trimethylammonium ethyl acrylate methyl sulfate) homopolymer.

In one embodiment, the polymer is a block copolymer having anionic blocks and neutral blocks, such as for example, a poly(styrene sulfonate)-b-polyacrylamide) block copolymer. In one embodiment, the copolymer of the present invention is a diblock copolymer in which the block A derives from acrylic acid and the block B derives from a cationic monomer chosen from DADMAC, MAPTAC and APTAC, more typically, DADMAC.

The amphoteric copolymer can in particular exhibit a theoretical or measured average molecular weight of between 500 and 50000 g/mol. The macromolecular chain(s) B, typically the block(s) B can in particular exhibit a theoretical or measured average molecular weight of between 500 and 49000 g/mol, typically between 2000 and 48000 g/mol. The macromolecular chain A, typically the block A, can in particular exhibit a theoretical or measured average molecular weight of between 250 and 20000 g/mol, typically between 500 and 10000 g/mol.

Parts that are ionic in the pH conditions of the formulation are usually considered as water-soluble. Thus, part A is usually considered as water-soluble. In a preferred embodiment of the invention, part B is water-soluble, or hydrophilic. Water-solubility of a part refers to the water-solubility that said part would have without the other part(s) that is the water-solubility of a polymer consisting of the same repeating units than said part, having the same molecular weight. By water-soluble part, polymer, it is meant that the part, polymer does not phase separate macroscopically in water at a concentration from 0.01% and 10% by weight, at a temperature from 20° C. to 30° C.

The amphoteric copolymer is typically water-soluble in any pH in which the components are not degraded, typically water-soluble over the whole of the pH range extending from 1 to 11, more typically from 4 to 9, and even more typically from 5 to 8. The nature and the proportions of the various units can be chosen to this end.

In one embodiment, the copolymer is made by anionic polymerization with sequential addition of 2 monomers as described for example by Schmolka, J. Am. Oil Chem. Soc. 1977, 54, 110; or alternatively Wilczek-Veraet et al. Macromolecules 1996, 29, 4036. Another method which can be used consists in initiating the polymerization of a part polymer at each of the ends of another part polymer as described for example by Katayose and Kataoka, Proc. Intern. Symp. Control. Rel. Bioact. Materials, 1996, 23, 899.

In one embodiment, the copolymer is made by living or controlled polymerization as defined by Quirk and Lee (Polymer International 27, 359 (1992)). Indeed, this particular method makes it possible to prepare polymers with a narrow dispersity and in which the length and the composition of the parts are controlled by the stoichiometry and the degree of conversion. In the context of this type of polymerization, there are more particularly recommended the copolymers which can be obtained by any so-called living or controlled polymerization method such as, for example: free-radical polymerization controlled by xanthates according to the teaching of Application WO 98/58974 and patent U.S. Pat. No. 6,153,705, or free-radical polymerization controlled by dithioesters according to the teaching of Application WO 98/01478.

Block copolymers obtained by a living or controlled free-radical polymerization process may comprise at least one transfer agent group at an end of the polymer chain. In one embodiment, such a group is removed or deactivated subsequent to polymerization. Living or controlled free-radical polymerization processes involve using a transfer agent, and implementing addition of different monomers to obtain block copolymers.

The preferred transfer agents for implementing the controlled polymerization process are dithioesters, thioethers-thiones, dithiocarbamates, or xanthates. The preferred polymerization is the living radical polymerization using xanthates.

While the terms "polymer" and "copolymer" as used herein include oligomers, the weight average molecular weight of the polymer is more typically from about 1000 to about 500,000 g/mol. It is even more typically less than 100,000 g/mol, and still more typically from about 15,000 to 50,000 g/mol. Within these ranges, the weight ratio of each block may vary. It is however typical that each block has a molecular weight above 500 g/mol, and typically above 1000 g/mol.

A polymer solution in accordance with the invention may be prepared by adding the desired amount of polymers in a powder form to deionized water, typically having a conductivity of M$\Omega$ (Purification ion-exchange filter, Millipore). The polymer and water are typically mixed for about 24 hours to achieve homogeneity with a concentration typically in the range of between about 1% or less. Water utilized in some embodiments of the present invention is typically water containing as little impurities are possible (which may counteract or suppress the effect of the inventive polishing composition) such as deionized water (DI water). Such impurities can be removed through various generally known processes such as ion exchange and filtration processes.

In one embodiment, the aqueous polymer solution or dispersion comprises from about 0.001 to about 5 wt %, more typically from about 0.01 to about 1 wt % of the polymer in an aqueous medium.

The aqueous medium in which the polymer is dissolved or dispersed typically comprises, as in the case of the above described aqueous medium of the slurry of nanoscale inorganic particles, at least 40 wt %, more typically at least 50 wt % water and even more typically at least 60 wt % water and may optionally further comprise one or more water miscible organic liquids, of the same type and in the same relative amounts as discussed above in regard to the aqueous medium of the slurry of nanoscale inorganic particles.

The copolymer can be provided in the solid form or in the form of a solution, for example an aqueous, alcoholic and/or aqueous/alcoholic solution (for example in an ethanol or isopropanol/water mixture). The concentration of the solution can, for example, be from 5 to 75% by weight, typically from 10 to 50% by weight.

It is mentioned that it would not be departing from the scope of the invention to employ and to adapt preparation processes resulting in triblock copolymers, if appropriate subsequently modified (for example during a specific stage or during a stage of destruction and/or deactivation and/or purification) so as to obtain diblock copolymers. In particular, it is possible to envisage employing transfer agents comprising several transfer groups (for example trithiocarbonates Z—S—CS—S—Z), resulting in telechelic copolymers of R-[(block B)-(block A)]$_w$ type, such as triblocks of (core)-[(block A)-(block B)]$_x$ type (for example (block A)-(block B)-R-(block B)-(block A), such as triblocks (block A)-(block B)-(core)-(block B)-(block A)), and then breaking the telechelic copolymers at the core (splitting, "cleaving"), in order to obtain diblock copolymers (block A)-(block B). Splitting can take place during a hydrolysis.

The dispersions of the invention exhibit a positive zeta potential within a pH range of between 1 and 11, more particularly between 3 and 11. In addition, this zeta potential can exhibit a stable value over a large part of this pH range. The term "stable value" is understood to mean a variation in the value of the zeta potential of at most 50% when the pH of a colloidal dispersion, with the amphoteric copolymer of the invention and exhibiting an initial pH of the order of 2 to 3, is varied within the above range.

The dispersions of the invention can be prepared by mixing a starting colloidal dispersion of the type described above in part A of the description with a solution of an amphoteric copolymer also described above in part B of the description. This mixing can be carried out at a temperature of between ambient temperature and 100° C., for example about 80° C. approximately. The mixing is typically carried out with vigorous stirring.

The dispersions can also be employed for their properties in combating UV radiation, for example in the preparation of films of polymers (of the acrylic or polycarbonate type, for example), of paints, of paper or of cosmetic compositions, in particular in the preparation of creams for protecting from UV radiation.

Examples will now be given.

In these examples, Examples 1 to 8 relate to the preparation of polymers and Examples 9 to 14 relate to colloidal dispersions. The relative molar masses of the neutral or anionic hydrophilic polymers (e.g.: poly(acrylic acid) and poly(acrylamide) homopolymers) are characterized by steric exclusion chromatography (SEC) using a Shodex OH pak SB-G precolumn, (No. L410061) and three Shodex columns of 30 cm OH pak SB-806M HQ (Nos. L 411 054; L 411 055; L 411 056) and a mobile phase comprising acetonitrile in a solution of deionized water additivated with 0.1 mol/l of NaNO$_3$, the acetonitrile/water ratio by volume being 20/80. The relative molar masses of the copolymers comprising a cationic block are characterized by steric exclusion chromatography (SEC) using a Shodex OH pak SB-G precolumn, (No. L211067) and three Shodex columns of 30 cm OH pak SB-806M HQ (Nos. L 301011; L 301013; L 301014) and a mobile phase comprising acetonitrile in a solution of deionized water additivated with 1 mol/l of $NH_4NO_3$ and 100 ppm of DADMAC (so as to passivate the columns), the acetonitrile/water ratio by volume being 20/80. All the measurements of the relative molar masses are made with respect to poly(ethylene oxide) standards.

In the examples, the water used is deionized water.

EXAMPLE 1

This example relates to the synthesis of poly(acrylic acid) (PAA).

31.87 g of O-ethyl S-(1-(methoxycarbonyl)ethyl)xanthate $(CH_3CHCO_2CH_3)S(C=S)OEt$, 101.3 g of ethanol, 8.5 g of acrylic acid and 23.64 g of deionized water are introduced at ambient temperature into a 2 l jacketed glass reactor equipped with a mechanical stirrer and a reflux condenser. The temperature of the solution is increased up to 70° C. As soon as this temperature has been reached, 0.49 g of 4,4'-azobis(cyanovaleric acid) is introduced. Starting with the introduction of this initiator, a solution of 76.5 g of acrylic acid in 212.8 g of water is introduced over one hour. At the end of the introduction, 0.49 g of 4,4'-azobis(cyanovaleric acid) is again introduced. The reaction is prolonged for three hours after the end of the introduction.

A sample of polymer is withdrawn. The analysis of the product by high performance liquid chromatography (HPLC) allows it to be concluded that all the acrylic acid has reacted during the polymerization. A steric exclusion chromatography (SEC) analysis with relative calibration with poly(ethylene oxide) provides the following number-average molar mass $(M_n)$ and polydispersity index $(M_w/M_n)$ values: $M_n$=650 g/mol, $M_w/M_n$=1.60.

EXAMPLE 2

This example relates to the synthesis of a P(acrylic acid-block-diallyldimethylammonium chloride) diblock copolymer: P(AA-DADMAC).

At the end of the synthesis of the first block, as described in Example 1, the temperature is reduced down to 65° C. Once this temperature has stabilized, a solution of 706 g of diallyldimethylammonium chloride (DADMAC) at 65% by weight in water, and also 4 g of V50 initiator sold by Wako (2,2'-azobis(2-methylpropionamidine) dihydrochloride), are introduced. The reaction is subsequently maintained at this temperature for twelve hours. After reacting for 4 hours and 8 hours, 4 g of V50 initiator are added on each occasion to the reaction medium. At the end of the reaction, a sample is withdrawn. A $^1$H NMR analysis gives a DADMAC conversion of 98.2%. $M_n$ and $M_w/M_n$ are measured by SEC in water with a poly(ethylene oxide) calibration curve: $M_n$=2500; $M_w/M_n$=1.50. The superimposition of the two chromatograms of the products from Example 1 and from Example 2 allows it to be concluded that the copolymer formed is diblock in nature. This is because the SEC chromatogram of the product from Example 1 is completely shifted towards the range of the higher molecular weights at the end of the synthesis of the product from Example 2.

EXAMPLE 3

This example relates to the synthesis of poly(acrylic acid) (PAA).

6.2 g of O-ethyl S-(1-(methoxycarbonyl)ethyl) xanthate $(CH_3CHCO_2CH_3)S(C=S)OEt$, 23.7 g of ethanol, 30 g of acrylic acid and 74.9 g of deionized water are introduced at ambient temperature into a 250 ml jacketed glass reactor equipped with a magnetic stirrer and a reflux condenser, and subjected to a stream of nitrogen for 5 min. The temperature of the solution is increased up to 70° C. As soon as this temperature has been reached, 0.167 g of 4,4'-azobis(cyanovaleric acid) is introduced. After refluxing for three hours, 0.167 g of 4,4'-azobis(cyanovaleric acid) is again introduced. The reaction is prolonged for a further four hours with magnetic stirring.

A sample of polymer is withdrawn. The analysis of the product by high performance liquid chromatography (HPLC) allows it to be concluded that all the acrylic acid has reacted during the polymerization. A steric exclusion chromatography (SEC) analysis with relative poly(ethylene oxide) calibration provides the following number-average molar mass $(M_n)$ and polydispersity index $(M_w/M_n)$ values: $M_n$=960 g/mol, $M_w/M_n$=1.70

EXAMPLE 4

This example relates to the synthesis of a P(acrylic acid-block-(3-acrylamidopropyl)trimethylammonium chloride) diblock copolymer: P(AA-APTAC).

At the end of the synthesis of the first block, as described in Example 3, the temperature is reduced down to 65° C. Once this temperature has stabilized, a solution of 15.7 g of (3-acrylamidopropyl)trimethylammonium chloride (APTAC) at 75% by weight in water, 0.073 g of V50 initiator (2,2'-azobis (2-methylpropionamidine) dihydrochloride) and 10 g of deionized water, degassed beforehand with a stream of nitrogen (5 min), are introduced into the solution of the first block. The reaction is subsequently maintained at this temperature (65° C.) for 9 h 30 with magnetic stirring. After reacting for 4 hours, a further 0.073 g of V50 initiator is added to the reaction medium. At the end of the reaction, a sample is withdrawn. A $^1$H NMR analysis gives an APTAC conversion of 99%. $M_n$ and $M_w/M_n$ are measured by SEC, after calibrating with poly(ethylene oxide), giving: $M_n$=2740 g/mol; $M_w/M_n$=1.50. The superimposition of the two chromatograms of the products from Example 3 and from Example 4 allows it to be concluded that the copolymer formed is of diblock nature. This is because the SEC chromatogram of the product from Example 3 is completely shifted towards the range of the higher molecular weights at the end of the synthesis of the product from Example 4.

EXAMPLE 5

This example relates to the synthesis of poly(acrylamide) (PAM).

12.6 g of O-ethyl S-(1-(methoxycarbonyl)ethyl) xanthate $(CH_3CHCO_2CH_3)S(C=S)OEt$, 39.8 g of ethanol, 60.0 g of a 50% acrylamide solution and 46.2 g of deionized water are introduced at ambient temperature into a 250 ml jacketed glass reactor equipped with a magnetic stirrer and a reflux condenser, and subjected to a stream of nitrogen for 5 min. The temperature of the solution is increased up to 70° C. As soon as this temperature has been reached, 0.169 g of 4,4'-azobis(cyanovaleric acid) is introduced. After refluxing for three hours, 0.169 g of 4,4'-azobis(cyanovaleric acid) is again introduced. The reaction is prolonged for an additional four hours with magnetic stirring.

A sample of polymer is withdrawn. The analysis of the product by high performance liquid chromatography (HPLC) allows it to be concluded that all the acrylamide has reacted during the polymerization. A steric exclusion chromatography (SEC) analysis with relative poly(ethylene oxide) calibration provides the following number-average molar mass ($M_n$) and polydispersity index ($M_w/M_n$) values: $M_n$=530 g/mol, $M_w/M_n$=2.45.

EXAMPLE 6

This example relates to the synthesis of a P(acrylamide-block-(3-acrylamidopropyl)trimethylammonium chloride) diblock copolymer: P(AM-APTAC).

At the end of the synthesis of the first block, as described in Example 5, the temperature is reduced down to 65° C. Once this temperature has stabilized, a solution of 31.4 g of (3-acrylamidopropyl)trimethylammonium chloride (APTAC) at 75% by weight in water, 0.034 g of V50 initiator (2,2'-azobis (2-methylpropionamidine) dihydrochloride) and 20 g of deionized water, degassed beforehand with a stream of nitrogen (5 min), are introduced into the solution of the first block. The reaction is subsequently maintained at this temperature (65° C.) for 9 h 30 with magnetic stirring. After reacting for 4 hours, a further 0.034 g of V50 initiator is added to the reaction medium. At the end of the reaction, a sample is withdrawn. A $^1$H NMR analysis gives an APTAC conversion of 99%. $M_n$ and $M_w/M_n$ are measured by SEC, after calibrating with poly(ethylene oxide), giving: $M_n$=3000 g/mol; $M_w/M_n$=1.50. The superimposition of the two chromatograms of the products from Examples 5 and 6 allows it to be concluded that the copolymer formed is of diblock nature. This is because the SEC chromatogram of the product from Example 5 is completely shifted towards the range of the higher molecular weights at the end of the synthesis of the product from Example 6.

EXAMPLE 7

This example relates to the synthesis of poly(acrylamide) (PAM).

4.22 g of O-ethyl S-(1-(methoxycarbonyl)ethyl) xanthate ($CH_3CHCO_2CH_3$)S(C=S)OEt, 25.0 g of ethanol, 60.0 g of a 50% acrylamide solution and 40.1 g of deionized water are introduced at ambient temperature into a 250 ml jacketed glass reactor equipped with a magnetic stirrer and a reflux condenser, and subjected to a stream of nitrogen for 5 min. The temperature of the solution is increased up to 70° C. As soon as this temperature has been reached, 0.167 g of 4,4'-azobis(cyanovaleric acid) is introduced. After refluxing for three hours, 0.167 g of 4,4'-azobis(cyanovaleric acid) is again introduced. The reaction is prolonged for an additional four hours with magnetic stirring.

A sample of polymer is withdrawn. The analysis of the product by high performance liquid chromatography (HPLC) allows it to be concluded that all the acrylamide has reacted during the polymerization. A steric exclusion chromatography (SEC) analysis with relative poly(ethylene oxide) calibration provides the following number-average molar mass ($M_n$) and polydispersity index ($M_w/M_n$) values: $M_n$=710 g/mol, $M_w/M_n$=2.25.

EXAMPLE 8

This example relates to the synthesis of a P(acrylamide-block-(3-acrylamidopropyl)trimethylammonium chloride) diblock copolymer: P(AM-APTAC).

At the end of the synthesis of the first block, as described in Example 7, the temperature is reduced down to 65° C. Once this temperature has stabilized, a solution of 30.9 g of (3-acrylamidopropyl)trimethylammonium chloride (APTAC) at 75% by weight in water, 0.011 g of V50 initiator (2,2'-azobis (2-methylpropionamidine) dihydrochloride) and 20 g of demineralized water, degassed beforehand with a stream of nitrogen (5 min), are introduced into the solution of the first block. The reaction is subsequently maintained at this temperature (65° C.) for 9 h 30 with magnetic stirring. After reacting for 4 hours, a further 0.011 g of V50 initiator is added to the reaction medium. At the end of the reaction, a sample is withdrawn. A $^1$H NMR analysis gives an APTAC conversion of 99%. $M_n$ and $M_w/M_n$ are measured by SEC, after calibrating with poly(ethylene oxide), giving: $M_n$=3180 g/mol; $M_w/M_n$=1.44. The superimposition of the two chromatograms of the products from Examples 7 and 8 allows it to be concluded that the copolymer formed is of diblock nature. This is because the SEC chromatogram of the product from Example 7 is completely shifted towards the range of the higher molecular weights at the end of the synthesis of the product from Example 8.

EXAMPLE 9

This example relates to the synthesis of a colloidal dispersion of cerium oxide.

A dilute cerium nitrate solution is prepared by addition of 6.4 kg of a 2.88M trivalent cerium nitrate solution (d=1.715), of 1.0 kg of a 68% $HNO_3$ solution, of 4.8 kg of deionized water and of 10.64 g of 1.39M tetravalent cerium nitrate (d=1.440). This solution, with a $Ce^{4+}/Ce_{total}$ molar ratio of 1/1500, is charged to a semiclosed tank and then degassed with vigorous stirring and while bubbling nitrogen through.

A dilute aqueous ammonia solution is prepared by addition of 22.6 kg of deionized water and of 4.6 kg of a 28% aqueous ammonia solution. This solution is charged to a 40 l semiclosed jacketed reactor and then stirred while bubbling nitrogen through.

The dilute cerium nitrate solution is subsequently added to the dilute aqueous ammonia solution at ambient temperature over 30 min while stirring and while flushing with nitrogen. The reaction mixture is subsequently raised in temperature to 80° C. over ¾ of an hour and then maintained at this temperature for 4 h, still while flushing with nitrogen.

On conclusion of this heat treatment, the reaction mixture is allowed to cool and then it is filtered and washed on a Nutsche filter. The cake is resuspended in deionized water and acidified by addition of 68% nitric acid, which results in a dispersion comprising 17.9% by weight of $CeO_2$ and with a pH of 3.0.

The size of the secondary particles is measured using a laser particle sizer of Horiba LA910 type, taking a value for the optical index of $CeO_2$ in water of 1.7. The median size $d_{50}$ is 109 nm. The dispersion index a/m, calculated from the $d_{10}$, $d_{50}$ and $d_{90}$ values of 89, 109 and 133 nm respectively, is 0.20.

The suspension is observed by TEM. It is found that the primary particles are indeed monodisperse and with a size centred around 60 nm. Each of the particles on a photograph of several hundred particles representative of the suspension is counted and measured, whereby a mean size of 62 nm with a standard deviation of 6 nm is obtained, which standard deviation represents 10% of the size of the mean value.

A portion of the dispersion is dried in an oven at 200° C., which makes it possible to obtain a $CeO_2$ powder for XRD analysis. The X-ray diffractogram for this powder has the signature of crystalline $CeO_2$ (ASTM card 34-394). The mean size of the coherent domain, calculated by application of the Scherrer model from the mid-height width of the diffraction peaks situated at 2θ=28.6°, 47.5° and 56.4°, gives 82 nm. The BET specific surface, determined by nitrogen adsorption, is 13.5 m²/g, which gives a mean size of the primary particles of 62 nm.

EXAMPLE 10

(According to the Invention)

This example relates to the synthesis of a colloidal dispersion of cerium oxide according to the invention which is stable and cationic over the entire pH range between 1 and 11.

Preparation of the Dispersion 80 g of a PAA-PDADMAC 0.5K-3K solution comprising 0.025% by weight of PAA-PDADMAC are prepared by diluting, with deionized water, the PAA-PDADMAC 0.5K-3K solution described in Example 2.

80 g of a 5% by weight colloidal $CeO_2$ dispersion are prepared by diluting, with deionized water, the colloidal $CeO_2$ dispersion described in Example 9.

The 5% by weight colloidal $CeO_2$ dispersion is added, at ambient temperature and with vigorous stirring, to the 0.025% by weight PAA-PDADMAC 0.5K-3K solution over 10 min. At the end of this addition, the $CeO_2$ concentration is 2.5% by weight. The PAA-PDADMAC/$CeO_2$ ratio by weight is 0.5% by weight.

The size of the secondary particles is measured using a laser particle sizer of Horiba LA910 type, taking a value for the optical index of $CeO_2$ in water of 1.7. The median size $d_{50}$ is 105 nm and the dispersion index σ/m, calculated from the $d_{10}$, $d_{50}$ and $d_{90}$ values of 89, 105 and 131 nm respectively, is 0.20.

An aliquot of this acidic colloidal dispersion is treated, with vigorous stirring, with a few drops of a 28% aqueous ammonia solution, so as to raise the pH to 10.6. No separation by settling is observed. The size of the secondary particles is measured using a laser particle sizer of Horiba LA910 type, taking a value for the optical index of $CeO_2$ in water of 1.7. The median size $d_{50}$ is 106 nm and the dispersion index σ/m, calculated from the $d_{10}$, $d_{50}$ and $d_{90}$ values of 88, 106 and 130 nm respectively, is 0.20.

Measurement of the Zeta Potential

A dilute $KNO_3$ solution is prepared by diluting 1.0110 g of $KNO_3$ (M=101.103 g/mol), made up to 100 g with deionized water. 10 g of the dilute $KNO_3$ solution and 86 g of deionized water are added to an aliquot of 4 g of the acidic colloidal dispersion of $CeO_2$ stabilized with PAA-PDADMAC, which results in a colloidal dispersion of $CeO_2$ stabilized with PAA-PDADMAC comprising 0.1% by weight of $CeO_2$ and $10^{-2}$ mol/l of $KNO_3$. The PAA-PDADMAC/$CeO_2$ ratio remains unchanged and equal to 0.5% by weight. The pH is 3.3 and the ionic conductivity is 1.7 mS/cm. The zeta potential is measured using a device of Malvern ZetaSizer Nano-ZS type. The curve of zeta potential is obtained by gradually increasing the pH up to pH=11 by addition of a $10^{-2}$ mol/l KOH solution. The same curve is drawn up with the colloidal $CeO_2$ dispersion described in Example 9.

FIG. 1 gives the curves of zeta potential thus obtained. The solid curve is that corresponding to the product from Example 10 and it shows that the zeta potential is positive over the entire pH range between pH=1 and pH=11. The curve given in dashes corresponds to that of the product from Example 9.

EXAMPLES 11 TO 14

Examples 11 and 12 relate to the synthesis of colloidal dispersions of cerium oxide according to the invention which are stable and cationic over the entire pH range between 1 and 11. Examples 13 and 14 are comparative examples which relate to colloidal dispersions of cerium oxide comprising a copolymer, no block of which comprises an anionic group.

Preparation of the Dispersions

Solution A: 100 ml of a 20 g/l colloidal $CeO_2$ dispersion are prepared by diluting, with deionized water, a perfectly transparent colloidal $CeO_2$ dispersion, the size of the secondary particles of which, measured by quasielastic light scattering (QELS), is 8 nm and the size of the primary particles of which is 3 nm. The pH is 1.4 and the ionic conductivity is 10 mS/cm.

Solution B: 100 ml of a solution of polymer at the concentration of 20 g/l are prepared in a beaker at ambient temperature and are stirred until a clear and transparent solution is obtained.

Solution B is added over 15 min to solution A, which is kept vigorously stirred and at ambient temperature. On conclusion of this addition, the final $CeO_2$ concentration is 10 g/l. The acidic colloidal $CeO_2$ dispersion, thus stabilized by the polymer, retains its initial properties, namely a perfect transparency and a perfect stability over time.

An aliquot of this acidic colloidal dispersion is treated, with vigorous stirring, with a few drops of a 28% aqueous ammonia solution, so as to raise the pH to 10.5. The size of the secondary particles of the basic colloidal dispersion of polymer—stabilized $CeO_2$ thus obtained, measured by QELS, is presented in Table 1 below. It is observed that the colloidal $CeO_2$ dispersions of Examples 11 and 12, stabilized with the polymers described in Examples 2 and 4, result in transparent solutions which are stable over time, the sizes of the particles of which, measured by QELS, are comparable with those measured before the beginning of the addition of the aqueous ammonia. In contrast, the colloidal $CeO_2$ dispersions of Examples 13 and 14, stabilized with the polymers described in Examples 6 and 8, result in unstable dispersions which flocculate.

TABLE 1

| Example | Polymer | Polymer concentration (g/l) | Polymer/$CeO_2$ ratio by weight | pH | QELS |
|---|---|---|---|---|---|
| 11 | P(AA-DADMAC) 0.5K-3K (Example 2) | 20 | 1 | 2.3 | 24 |
|  |  |  |  | 5.3 | 25 |
|  |  |  |  | 6.7 | 24 |
|  |  |  |  | 7.8 | 22 |
|  |  |  |  | 8.5 | 23 |
|  |  |  |  | 9.5 | 22 |
|  |  |  |  | 10.6 | 22 |
| 12 | P(AA-APTAC) 1K-3K (Example 4) | 20 | 1 | 2.0 | 17 |
|  |  |  |  | 5.3 | 17 |
|  |  |  |  | 7.1 | 18 |
|  |  |  |  | 8.2 | 18 |
|  |  |  |  | 9.0 | 17 |
|  |  |  |  | 10.4 | 18 |
| 13 | P(AM-APTAC) 0.5K-3K (Example 6) | 20 | 1 | 3.4 | Flocculation |
|  |  |  |  | 5.4 | Flocculation |
|  |  |  |  | 7.3 | Flocculation |
|  |  |  |  | 9.5 | Flocculation |
|  |  |  |  | 10.6 | Flocculation |
| 14 | P(AM-APTAC) 1.5K-9K (Example 8) | 20 | 1 | 3.3 | Flocculation |
|  |  |  |  | 5.5 | Flocculation |
|  |  |  |  | 6.6 | 121 |

Measurement of the Zeta Potential

A dilute $KNO_3$ solution is prepared by diluting 1.0110 g of $KNO_3$ (M=101.103 g/mol), made up to 100 g with deionized water. 10 g of the dilute $KNO_3$ solution and 86 g of deionized water are added to an aliquot of 4 g of the acidic colloidal dispersion of $CeO_2$ stabilized with PAA-PDADMAC (polymer resulting from Example 2 with the addition of $CeO_2$ according to Example 11), which results in a colloidal dispersion of $CeO_2$ stabilized with PAA-PDADMAC comprising 0.1% by weight of $CeO_2$ and $10^{-2}$ mol/l of $KNO_3$. The PAA-PDADMAC/$CeO_2$ ratio by weight is equal to 1. The pH is 3.3 and the ionic conductivity is 1.7 mS/cm. The zeta potential is measured using a device of Malvern ZetaSizer Nano-ZS type. The curve of zeta potential is obtained by gradually increasing the pH up to pH=11 by addition of a $10^{-2}$ mol/l KOH solution.

FIG. 2 gives the curves of zeta potential thus obtained. The solid curve is that corresponding to the product from Example 11 and it shows that the zeta potential is positive over the entire pH range between pH=1 and pH=10.7. The curve given in dashes corresponds to that of the colloidal $CeO_2$ dispersion of solution A, thus without addition of polymer.

CMP Experiments

Experiment 1

By using the slurry of the present invention, it is possible in a polishing process to achieve a nitride removal rate of greater than about 100 nm/min and an oxide removal rate of less than about 3 nm/min, typically at about pH 4 and 5. Furthermore, the removal rates of both oxide and nitride can be tuned by varying the abrasive to polymer weight ratio, pH of the slurry and particle size of the ceria, among others.

The results using ceria-based slurries according to the present invention show nitride removal rates above 100 nm/min and oxide removal that are below 3 nm/min. Additionally, these rates can be varied and controlled by varying one of several parameters associated with the slurry. The effect of particle size (25 nm and 60 nm) and particle loading (0.25 wt %-1 wt %) of the ceria abrasives on oxide and nitride removal rates at pH 4 and 5 in the presence of the cationic polymer were evaluated. The cationic polymer utilized was diblock PAA-PDADMAC with a weight average molecular weight of about 500 g/mol to about 3000 g/mol. Specifications of different ceria abrasive samples used are shown below.

TABLE 1b

Characteristics of 10% by weight ceria dispersion

| Sample Number | Product Code | Primary particle size ($d_{mean}$, nm) | Secondary particle size ($d_{mean}$, nm) | Surface Treatment (X = polymer to abrasive ratio) | pH range where slurry is stable |
|---|---|---|---|---|---|
| 1 | $CeO_2$ HC 25 (0) | 25 | 83 | No | 3-5 |
| 2 | $CeO_2$ HC 60 (0) | 60 | 163 | No | 3-5 |
| 3 | $CeO_2$ HC 25 (2+) | 25 | 64-90 | Yes (X = 0.2 to 1.25) | 3-10 |
| 4 | $CeO_2$ HC 60 (2+) | 60 | 140-170 | Yes (X = 0.2 to 1.25) | 3-10 |

Ceria (Cerium Oxide) abrasives were obtained as highly-crystallite colloidal dispersions. Characteristics of these suspensions are provided in Table 1b. 6 inch diameter blanket silicon dioxide and silicon nitride film covered silicon wafers were obtained from Montco Silicon Technologies, Inc., (The silicon nitride films were deposited over a layer of 100 nm oxide). For adjusting the pH, either nitric acid or potassium hydroxide, obtained from Fisher Scientific Inc., was used.

One or more cationic polymers of the present invention were added to the dispersion. Without being bound by theory, it is believed that since the oxide surface is negatively charged throughout the pH range 2-12, cationic polymer additive in the slurry will adsorb on the oxide surface, but not on the positively charged nitride surface. This may lead to the suppression of oxide removal rate while maintaining the nitride removal rate, leading to reverse selectivity i.e., high silicon nitride and low silicon dioxide removal.

Polishing experiments were carried out using a POLI-500 polisher (obtained from GnP Technology). The polishing conditions were typically 4/5.5 psi operating pressure/retaining ring pressure, 75/75 rpm carrier/platen speed, and a slurry flow rate of ~200 ml/min. The polishing pad (IC-1000) was conditioned (in-situ) for one minute using a diamond-grit pad conditioner (obtained from Abrasive Technology Inc.). Each time, two wafers each of $SiO_2$ and $Si_3N_4$ were polished. The removal rates (RR) were calculated from the difference in the film thickness, measured using a Filmetrics F-20 interferometer, before and after polishing at 17 points (8 points were chosen at a distance of 75 mm from the center, 8 points at a distance of 38 mm from the center and one at the centre). The standard deviation of the RR was also determined using these data. The polish results shown are an average of the removal rates for the two wafers.

Friction coefficients were also measured during polishing to identify the effect of the added polymer, if any. The real time-frictional coefficient was measured using the multi-sensor monitoring system available with the POLI-500 polisher.

Thermo Gravimetric Analysis ("TGA") was used to quantify the amount of additive adsorbed on silica (which mimics the $SiO_2$ film), ceria and $Si_3N_4$ (which mimics the silicon nitride film) powders. A Perkin-Elmer Thermo gravimetric analyzer, Pyris 1 TGA, was used to measure the weight of the additive-coated samples as a function of temperature in a nitrogen medium. TGA data of the ceria, silica and $Si_3N_4$ samples with or without additives (e.g., cationic polymer of the present invention) were obtained in the nitrogen medium in order to prevent the oxidation of the nitride film as well as the polymer additive. For all the samples, the temperature was increased from 30° C. to 600° C. at a rate of 15° C. per minute and the normalized sample weight is reported. Cerium Particle Abrasive:polymer ratio was maintained the same as that of samples used for zeta potential measurement.

Figure 3:
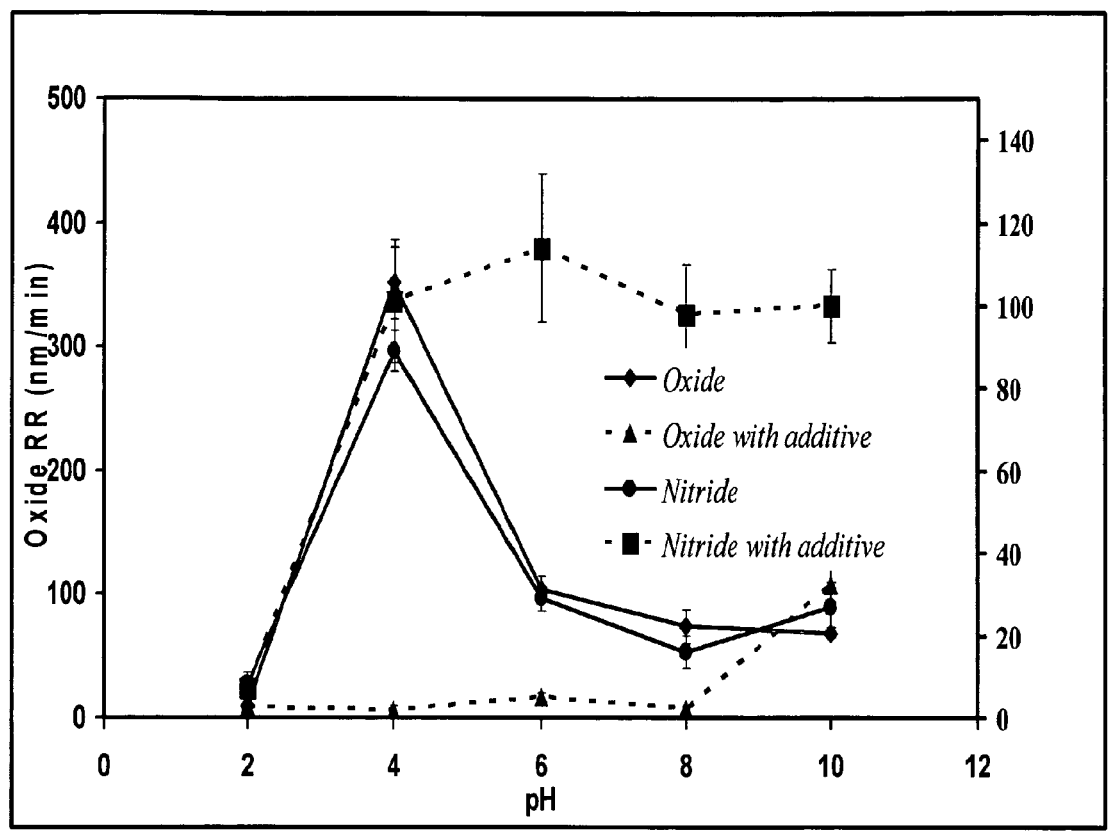
FIG. 3 illustrates addition of the cationic polymer of the present invention to the calcined ceria slurry effectively suppressed the oxide removal rate to <10 nm/min while the oxide removal rate is maintained at 100 nm/min except at pH 10.

Polishing with calcined ceria-based slurries: Slurries containing ceria particles (~60 nm) were used with and with out the polymer of the present invention to polish silicon dioxide and silicon nitride films. The measured removal rates for 0.25 wt % particle loading (i.e., concentration of the particles in dispersion/solution) are shown in the FIG. 1. PAA (0.01%) was added to stabilize the slurry when polishing at pH>5.5. Removal rates of oxide and nitride were found to be high, ~350 nm/min and ~95 nm/min, respectively, at pH 4 and low at higher pH values (pH 6 to 10). These high removal rates of oxide and nitride in the acidic region at pH 4 may be due to the strong electrostatic attractive forces between the positively charged ceria abrasives and the negatively charged oxide film. It is believed that the addition of PAA at pH>5.5 changes the surface properties of the ceria and the polishing film, which may be the reason for obtaining lower removal rates of both oxide and nitride when the pH is increased. Referring to FIG. 3, the addition of the cationic polymer of the present invention to the calcined ceria slurry effectively suppressed the oxide removal rate to <10 nm/min while the oxide removal rate is maintained at 100 nm/min except at pH 10.

Figure 4:
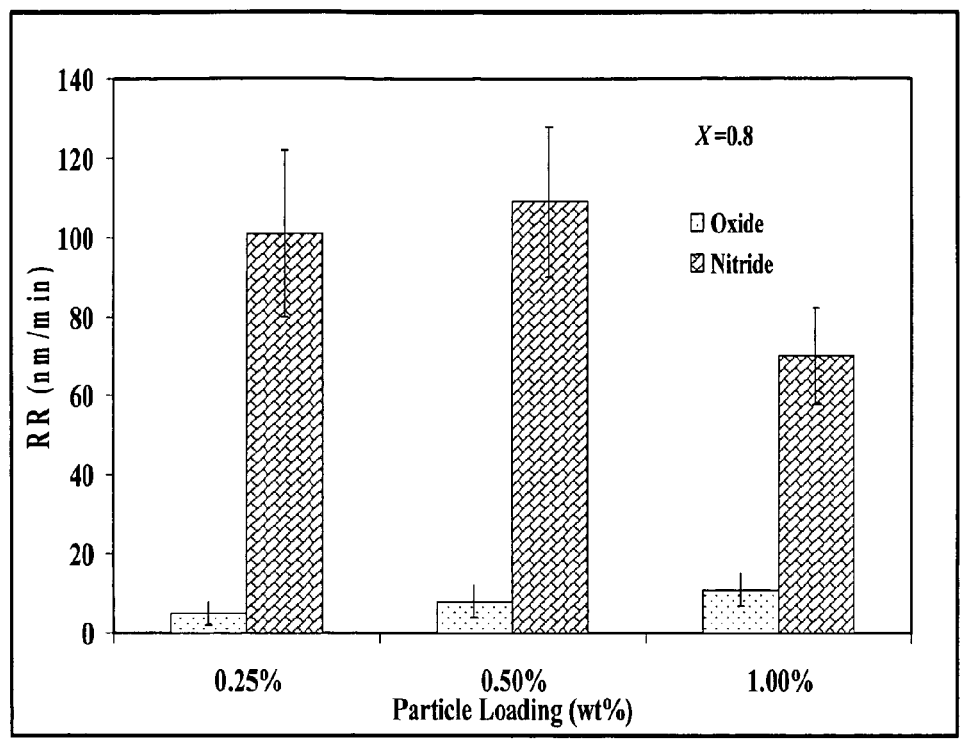
FIG. 4 illustrates the removal rates of nitride and oxide at pH 4 for three different values of particle loading.

Referring now to FIG. 4, the figure shows the removal rates of nitride and oxide at pH 4 for three different values of particle loading. For these experiments, the abrasive to polymer ratio was also maintained at X=0.8. Nitride removal rate was about ~100 nm/min in case of 0.25% and 0.5% ceria loading but decreased to ~70 nm/min at 1% ceria loading.

Figure 5:
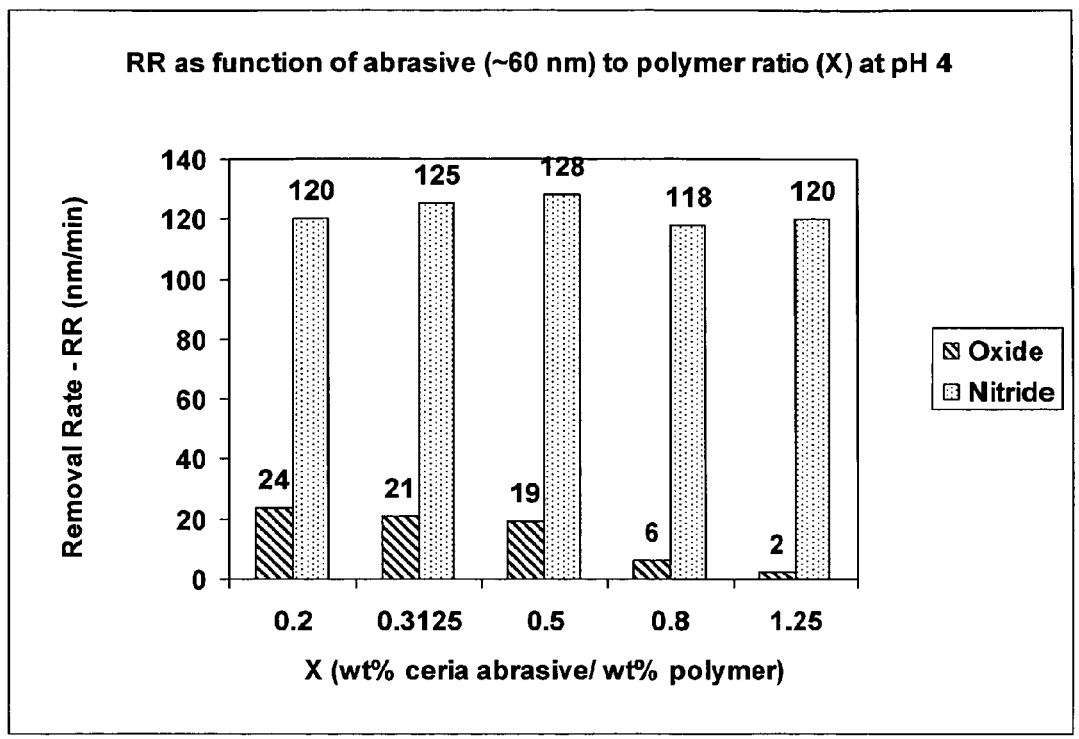
FIG. 5 illustrates the variability of the removal rates of nitride and oxide at pH 4 obtained by varying the abrasive (~60 nm) to polymer weight ratios in the polishing slurry.
Figure 6:
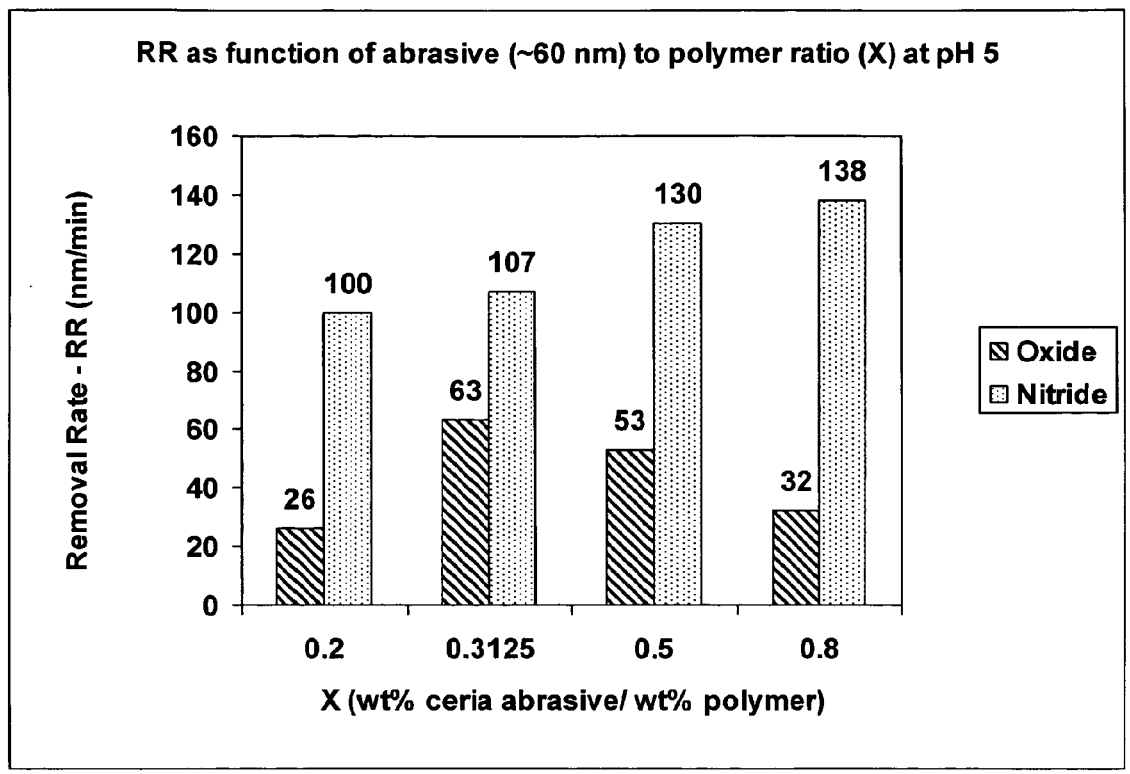
FIG. 6 illustrates the variability of the removal rates of nitride and oxide at pH 5 obtained by varying the abrasive (~60 nm) to polymer weight ratios in the polishing slurry.

FIGS. 5 and 6 show the variability of the removal rates of nitride and oxide at pH 4 and 5, respectively, obtained by varying the abrasive (~60 nm) to polymer weight ratios in the polishing slurry. At pH 4, nitride removal rate was more or less constant at ~120 nm/min, but the oxide removal rate decreased from ~25 nm/min to <4 nm/min when the polymer/abrasive ratio is increased from 0.2 to 1.25. At pH 5, the nitride removal rates were increased from 110 nm/min to 140 nm/min while the oxide removal rates were decreased from ~60 nm/min to only ~30 nm/min when the polymer/abrasive ratio is increased from 0.3125 to 0.8.

Figure 7:
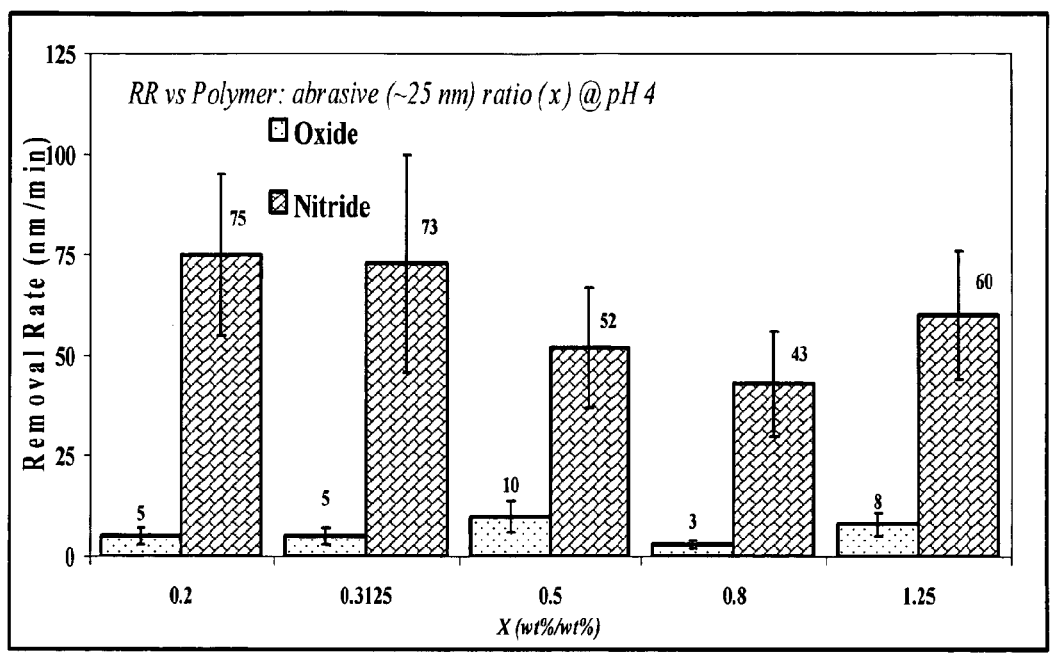
FIG. 7 illustrates the polish rates of blanket silicon dioxide and nitride films with 25 nm ceria particles tested at pH 4 with different abrasive/polymer ratios.
Figure 8:
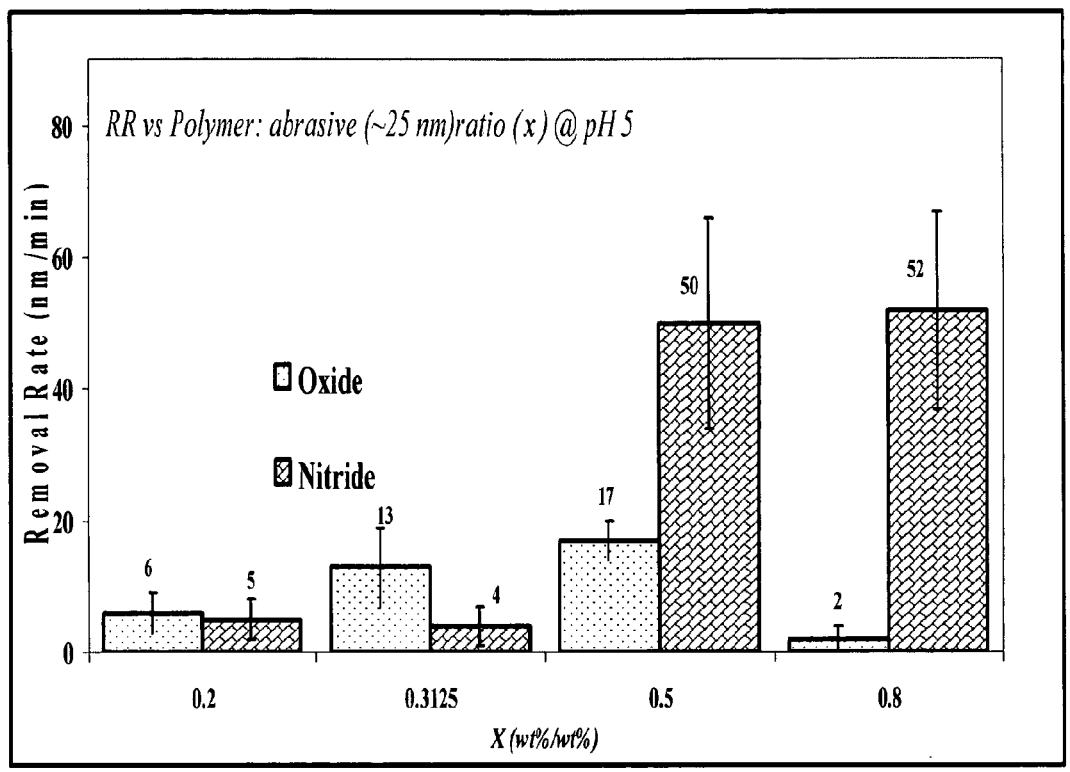
FIG. 8 illustrates the polish rates of blanket silicon dioxide and nitride films with 25 nm ceria particles tested at pH 5 with different abrasive/polymer ratios.

As it is believed that the size of the ceria abrasives in the slurry plays a significant role in determining the removal rates, 25 nm ceria particles were also tested at pH 4 and 5 with different abrasive/polymer ratios. Results are shown in FIGS. 7 and 8. At pH 4, the silicon nitride removal rate was in the range of 40-75 nm/min but the silicon oxide removal rate was suppressed from 10 nm/min to ~3 nm/min, when the abrasive to polymer ratio was increased from 0.5 to 0.8. At pH 5, the nitride removal rate was observed to be ~50 nm/min in case of polymer/abrasive ratios of 0.5 and 0.8, but more importantly, the oxide removal rate was decreased from ~17 nm/min to ~2 nm/min, when the abrasive to polymer ratio was increased from 0.5 to 0.8.

Figure 9:
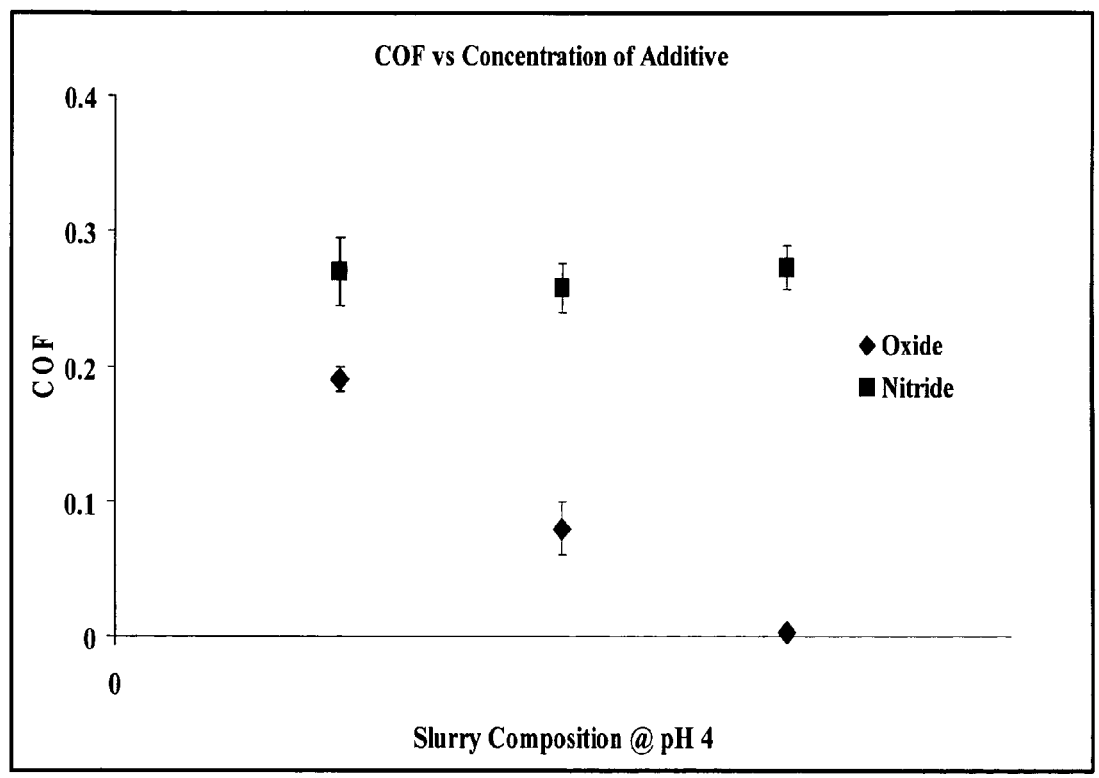
FIG. 9 shows the variation of frictional coefficient of oxide and nitride films during polishing with ceria slurry (particle loading-0.25%) with or without additives at pH 4.

FIG. 9 shows the variation of frictional coefficient observed for oxide and nitride films, respectively during polishing with ceria slurry (particle loading-0.25%) with and without additives at pH 4. The friction coefficient for the oxide film was found to be ~0.2, when polished with bare ceria slurry without any additives. When the polymer to abrasive ratio is 0.2, the friction coefficient was reduced by half to ~0.1 and it was further reduced to ~0.00025 on increasing the polymer/abrasive ratio to 1.25. This suggests that the polymer adsorption on to the ceria surface increases as the polymer concentration in the slurry increases from X=0.2 to X=1.25. But in the case of nitride films, the friction coefficient was observed to be the same ~0.27, in the presence and absence of the additive, as shown in FIG. 8, indicating either that there is no significant adsorption of the polymer on the nitride surface or if it adsorbs, it does not alter the friction coefficient.

Table 2a, below, shows the TGA results for silica, ceria and silicon nitride particles (no additives) and for cationic polymer-coated silica at pH 4. As expected, for pure silica (without additives), there is no weight loss. A weight loss of ~3% was observed in case of 2% silica+0.05% cationic polymer and ~6.1% was observed in 2% silica+0.2% cationic polymer. A similar trend was observed in the case of ceria also (Table 2). A weight loss of ~2.5% and ~6.12% was observed when X is 0.2 and 1.25, respectively. But in case of silicon nitride, the weight loss was found to be a much smaller ~0.15% and ~0.19% in case of 2% silicon nitride+0.05% cationic polymer and 2% silicon nitride+0.2% cationic polymer, respectively. The observed adsorption on the nitride powder and the film may be due to the presence of a native oxide layer on the surface of the nitride powder and is consistent with the invariance of the friction coefficient when X is changed from 0 to 1.25. (referring back to FIG. 9). Thus, it appears that the adsorption of cationic polymer increases significantly as the polymer to abrasive ratio increases on both silica and ceria, but not on the nitride surface.

In all the three cases ($CeO_2$, $SiO_2$ and $Si_3N_4$), a small negligible weight loss was observed in between 40° C. to 100° C., which may be due to the presence of water in the sample expected from the hygroscopic nature of the polymer.

TABLE 2a

TGA of abrasives coated with polymer at pH 4

| Slurry Composition | Normalized weight loss (starting at ~195° C.) |
|---|---|
| X = 0 | ~0.00% |
| X = 0.2 | ~2.52% |
| X = 1.25 | ~6.12% |
| 2% silica | ~0.00% |
| 2% silica + 0.05% polymer | ~3.03% |
| 2% silica + 0.2% polymer | ~6.20% |
| 2% silicon nitride | ~0.00% |
| 2% silicon nitride + 0.05% polymer | ~0.15% |
| 2% silicon nitride + 0.2% polymer | ~0.19% |

Table 2b shows the contact angle measured on silicon dioxide and silicon nitride surfaces after polishing with different concentrations of polymer in the ceria slurry (X=0, 0.2, 0.8 and 1.25). As the additive concentration is increased in the slurry from X=0 to X=1.25, the contact angle also increased from ~44° to ~68° in case of oxide films but it remained constant ~33° in case of nitride films. This indicates that there was significant adsorption of the polymer only on the oxide film and not on the nitride film.

TABLE 2b

Contact angle of a water drop on polished silicon dioxide and silicon nitride at pH 4

| Polished Slurry at pH 4 | Contact angle (degrees) | |
|---|---|---|
|  | Oxide Substrate | Nitride Substrate |
| X = 0.0 | 44 ± 3 | 33 ± 2 |
| X = 0.2 | 54 ± 4 | 35 ± 4 |
| X = 0.8 | 60 ± 6 | 33 ± 9 |
| X = 1.25 | 68 ± 3 | 34 ± 8 |

The ceria slurry with polymer added according to one embodiment of the present invention leads to high nitride (>100 nm/min) and low oxide (<3 nm/min) removal rates at pH=4 and 5. It is believed that the interaction of the cationic polymer of the present invention with ceria, silica, silicon nitride abrasives, and silicon dioxide ($SiO_2$) and silicon nitride ($Si_3N_4$) polishing films was investigated to understand better the polishing of these films in the presence of this additive. Frictional Coefficient, TGA, contact angle and zeta potential (not shown) data show that the adsorption of this cationic polymer on to the ceria abrasive and the polishing oxide film but not on to the nitride surface. It was also observed that the additives are adsorbed on ceria and silicon nitride surfaces even at pH where the electrostatic forces are repulsive. The results have been used to relate the adsorption behavior of this additive on the abrasives and the polishing films to the polishing results.

Experiment 2

Particle size distribution of ceria abrasive particles of different sizes (untreated/surface treated) was measured using a Zeta-Plus apparatus (Brookhaven Instruments). Zeta potentials of ceria abrasives (60 nm) were measured at various pH values using a Zeta-Plus apparatus (Brookhaven Instruments). All the slurry samples were prepared in 0.01 M $KNO_3$ solutions and the slurry pH was adjusted using dilute HNO3 or NH4OH, as needed. The cationic polymer utilized was diblock PAA-PDADMAC with a weight average molecular weight of about 500 g/mol to about 3000 g/mol.

Silicon wafers (6-inch dia) covered with thermally deposited silicon dioxide and low pressure chemical vapor deposited (LPCVD) silicon nitride films were polished using a Westech-372 polisher. The thicknesses of the deposited oxide and nitride films were 2000 nm and 500 nm, respectively. The experimental conditions used to obtain the polishing results are shown in Table 3, and were same for all the experiments unless otherwise stated. The polishing pad (IC 1000 with k groove) was hand conditioned for 1 min using a 4-inch diameter diamond grit conditioner. Thickness of blanket oxide and nitride films before and after polishing was measured using a Filmetrics F20 interferometer. The polish rates were determined from the difference in the film thickness at 17 test spots before and after polishing for 1 min. Surface roughness before and after CMP was measured using a Horizon non-contact optical profilometer. The slurry used for evaluating all the slurries mentioned in this report contained 0.25 wt % ceria in DI water unless otherwise mentioned. The pH of the slurries were adjusted with $HNO_3$ and $NH_4OH$.

TABLE 3

Experimental conditions used for film polishing using a Westech-372 polisher

| Films | Oxide and Nitride on 6" wafers |
|---|---|
| Pressure | 4 psi |
| Back Pressure | 0 psi |
| Platen/Carrier Speed | 75/75 rpm |
| Slurry Flow Rate | 200 ml/min |
| Polishing Time | 1 min |
| Pad | IC 1000 (k-groove) |

A general summary for the treated ceria particles (HC 60 (2+) and HC 25 (2+)) with different polymer to ceria ratios are listed below:

a) Polishing ability of 60 nm and 25 nm coated ceria particles with varying ceria to polymer ratios (0.2, 0.3125, 0.5, 0.8 and 1.25 wt %) was evaluated for high nitride low oxide effect; b) 60 nm coated ceria particles (07MGE075 series) produced higher removal rates (~120 nm/min) of nitride when compared to the 25 nm coated ceria particles (075MGE076 series) (~75 nm/min) at pH 4; c) At pH 5 the 60 nm coated ceria particles produced higher nitride removal rates (~130 nm/min) but the oxide removal rates were not suppressed significantly (~50 nm/min). The 25 nm coated ceria particles at pH 5 both nitride (~50 nm/min) and oxide (~15 nm/min) removal rates were suppressed; d) In order to check the repeatability of the performance of 60 nm coated ceria particles, polishing experiments were repeated with varying ceria to polymer ratio (07MGE094 series); e) Zeta potential measurements of all the samples show that they are positively charged at pH 3-5 (~+50 mv). It was observed that 60 nm ceria with 1.25 wt % to polymer ratio at pH 4 results in optimal nitride to oxide selectivity (i.e., a reverse selectivity of about 120:8)

Evaluation of HC (2+) 60 nm and 25 nm cationic polymer coated ceria abrasives: Table 4 and 5 list the Sample ID information (cationic polymer) of 60 nm and 25 nm cationic ceria particles respectively. 07MGE075 and 07MGE076 samples correspond to diblock PAA-PDADMAC with a weight average molecular weight of about 500 g/mol to about 3000 g/mol.

TABLE 4

60 nm ceria particles and cationic polymer

| Sample ID | Particle Size (nm) | Ceria to Polymer Ration (wt %:wt %) |
|---|---|---|
| 07MGE075-01 | 60 | 0.2 |
| 07MGE075-02 | 60 | 0.5 |
| 07MGE075-03 | 60 | 0.8 |
| 07MGE075-04 | 60 | 1.25 |
| 07MGE075-05 | 60 | 0.3125 |

TABLE 5

25 nm ceria particles and cationic polymer

| Sample ID | Particle Size (nm) | Ceria to Polymer Ration (wt %:wt %) |
|---|---|---|
| 07MGE076-01 | 25 | 0.2 |
| 07MGE076-02 | 25 | 0.5 |
| 07MGE076-03 | 25 | 0.8 |
| 07MGE076-04 | 25 | 1.25 |
| 07MGE076-05 | 25 | 0.3125 |

Figure 10:
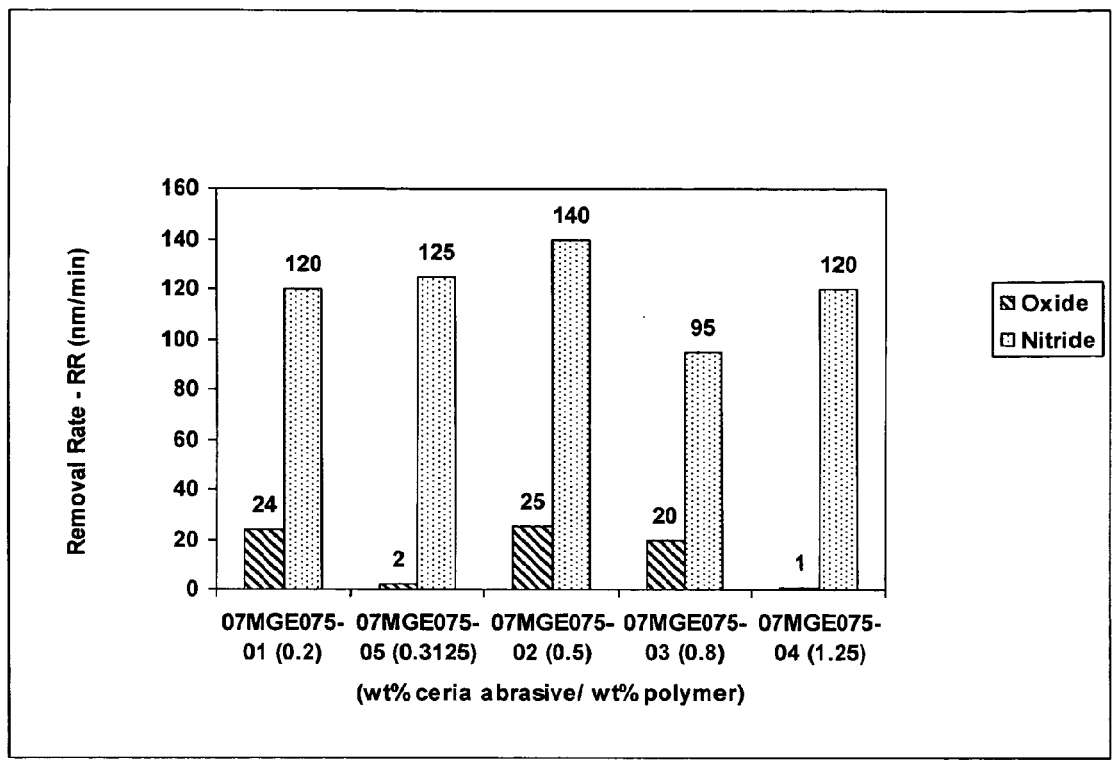
FIG. 10 illustrates the removal rate behavior of 60 nm cationic ceria particles with different ceria to polymer ratios.

With these samples reused, i.e., not fresh, oxide and nitride 6" wafers were polished using 0.25 wt % of ceria slurry at pH 4 and pH 5. Referring now to FIG. 10, it shows the removal rate behavior of 60 nm cationic ceria particles with different ceria to polymer ratios. From FIG. 10, it is evident that the oxide removal rate was suppressed to 2 nm/min with highest ceria to polymer ratio sample (1.25 wt %).

Figure 11:
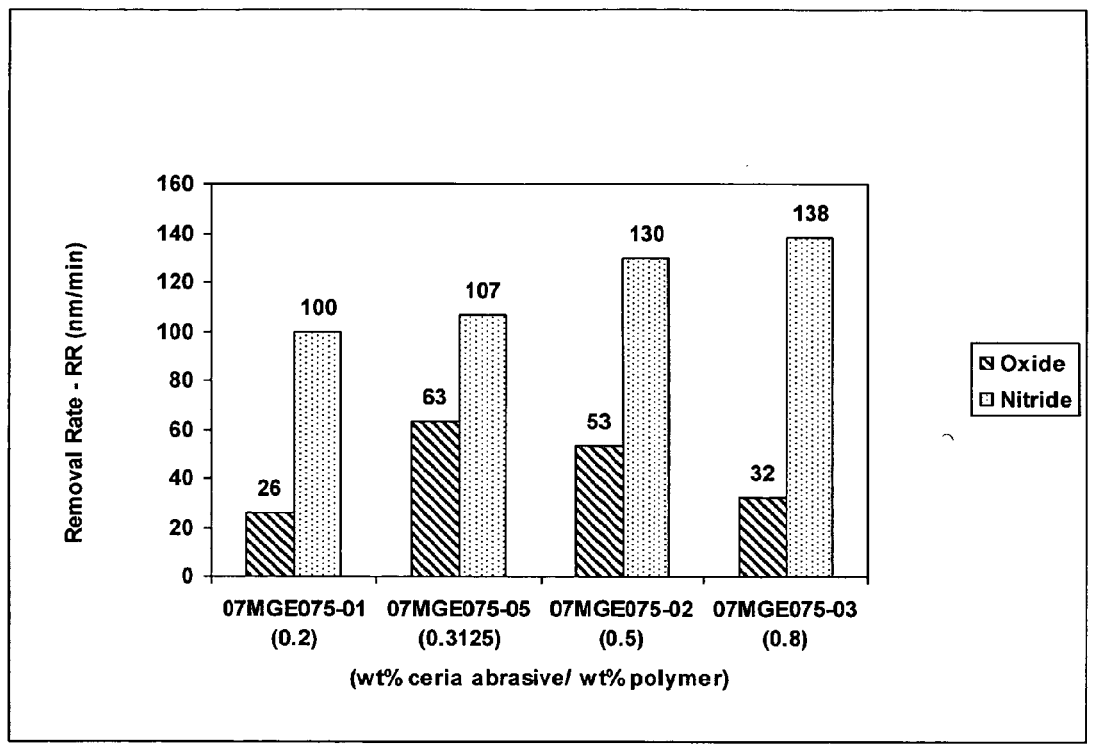
FIG. 11 shows the removal rates of nitride and oxide with different 60 nm ceria samples at pH 5.

Referring now to FIG. 11, it shows the removal rates of nitride and oxide with different 60 nm ceria samples at pH 5. It was observed that even though nitride removal rates did not get suppressed, the oxide removal rates went up from 2 nm/min at pH 4 to ~50 nm/min at pH 5. Therefore it is beneficial to optimize the ceria to polymer ration at pH 4 to achieve better high nitride to low oxide selectivity Zeta potential measurements were conducted on all the 60 nm cationic ceria particles with various ceria to polymer ratios. Table 6 shows the measurements obtained 7 at various pH values. The zeta potential measurements technique is explained in greater details below.

TABLE 6

Zeta potential measurements of 60 nm (HC 2+) ceria particles as a function of pH.

| | Zeta Potential (mV) | | | | |
|---|---|---|---|---|---|
| pH | 07MGE075-01 (0.2 wt %) | 07MGE075-02 (0.5 wt %) | 07MGE075-03 (0.8 wt %) | 07MGE075-04 (1.25 wt %) | 07MGE075-05 (0.3125 wt %) |
| 3 | 21 ± 3 | 47 ± 3 | 50 ± 9 | 42.5 ± 4 | 50 ± 3 |
| 4 | 28 ± 4 | 40 ± 4 | 34 ± 13 | 48 ± 9 | 53 ± 4 |
| 5 | 32 ± 5 | 34 ± 6 | 37 ± 4 | 25 ± 4 | 20 ± 6 |
| 6 | 27 ± 6 | 18 ± 6 | 38 ± 8 | 23 ± 3 | 40 ± 3 |
| 7 | −12 ± 2 | −14 ± 7 | 19 ± 5 | 17 ± 3 | 13 ± 3 |
| 10 | −11 ± 4 | | 24 ± 8 | −14 ± 7 | 5 ± 1 |

Table 6 shows that the ceria abrasives with higher ceria to polymer ratio are positively charged through out the pH range and the magnitude of positive charge is higher at pH 3 and 4.

Figure 12:
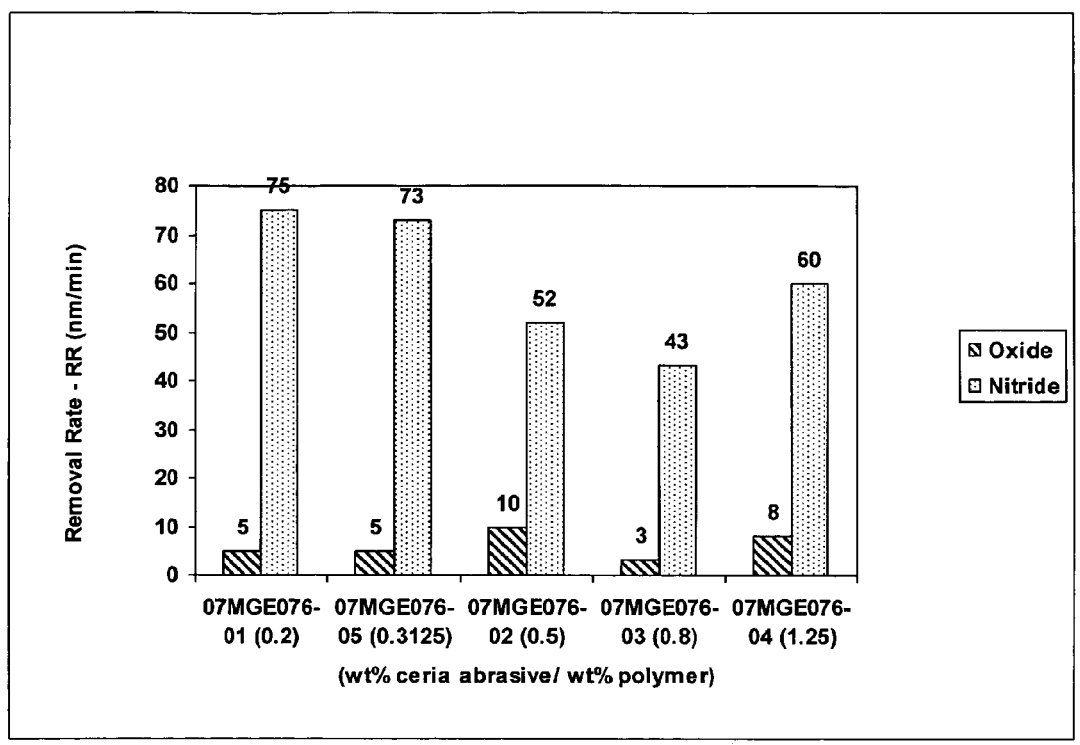
FIG. 12 shows the removal rates of nitride and oxide obtained with the treated 25 nm ceria abrasives with various ceria to polymer ratios at pH 4.

FIG. 12 shows the removal rates of nitride and oxide obtained with the treated 25 nm ceria abrasives with various ceria to polymer ratios at pH 4. It can be observed that the blanket nitride removal rates are not as high as that obtained with 60 nm ceria abrasives even though the suppression of oxide removal rate (~10 nm/min) is observed.

Figure 13:
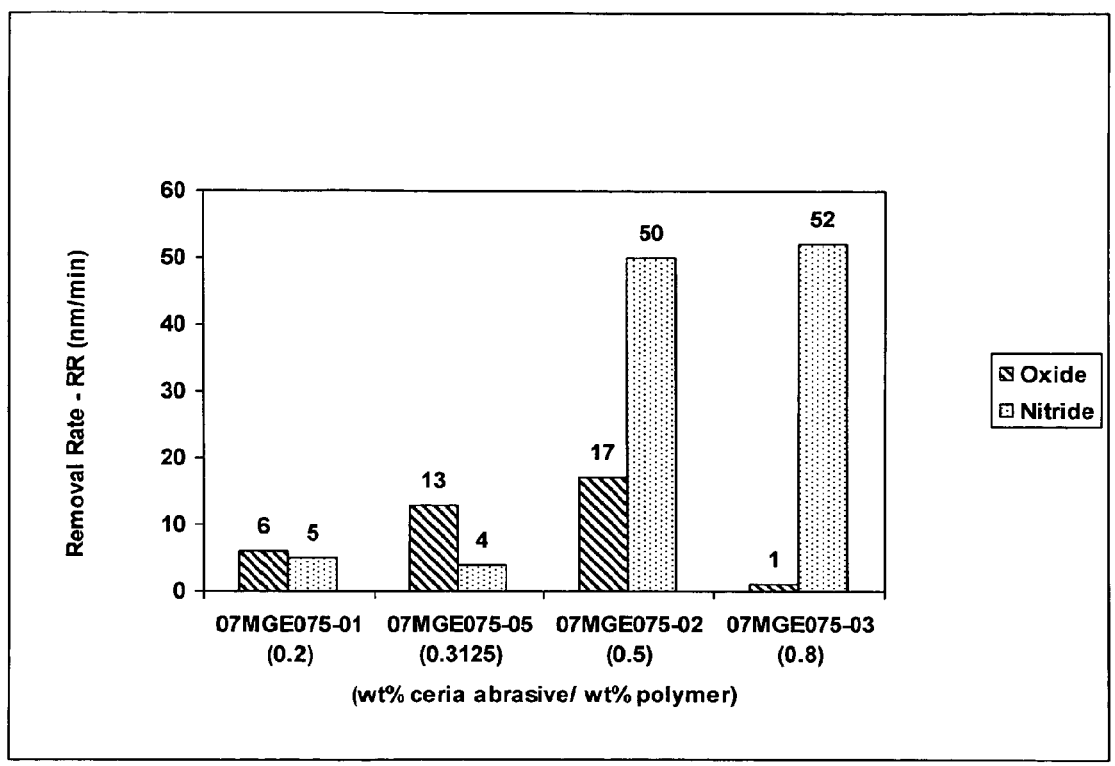
FIG. 13 represents the removal rate data of nitride and oxide films polished with 25 nm ceria particles at pH 5.

Similar experiments were performed with 25 nm treated ceria particles at pH 5. FIG. 13 represents the removal rate data of nitride and oxide films polished with 25 nm ceria particles at pH 5. Blanket wafer removal rate data on nitride and oxide were not obtained with 25 nm ceria particles with ceria to polymer ration of 1.25 wt %. It is noted that the blanket nitride removal rates were not as high as observed with 60 nm treated ceria particles at pH 5. Zeta potential measurements as a function of pH were carried out on three samples as shown in Table 7 and the abrasives are not strongly positively charged as observed with 60 nm treaded ceria particles.

TABLE 7

Zeta potential measurements on 25 nm treated ceria particles.

| | Zeta Potential (mV) | | |
|---|---|---|---|
| pH | 07MGE076-01 (0.2 wt %) | 07MGE076-03 (0.8 wt %) | 07MGE076-05 (0.3125 wt %) |
| 3 | 37 ± 3 | 35 ± 3 | 51 ± 5 |
| 4 | 31 ± 2 | 37 ± 4 | 36 ± 4 |
| 5.1 | 21 ± 1 | 32 ± 2 | 26 ± 2 |
| 6.5 | −23 ± 2 | 31 ± 4 | 16 ± 6 |
| 8.9 | −21 ± 5 | 17 ± 2 | 17 ± 7 |
| 10 | −26 ± 2 | −11 ± 5 | −23 ± 2 |

To check the reproducibility of the removal rates of blanket nitride and oxide films obtained with the treated 60 nm ceria particles, new ceria samples with similar ceria to polymer ratio were tested with new blanket films. The sample ID's and information is provided in Table 8. The samples correspond to diblock PAA-PDADMAC with a weight average molecular weight of about 500 g/mol to about 3000 g/mol.

TABLE 8

Sample information for 60 nm cationic ceria particles.

| Sample ID | Size (nm) | Ceria to Polymer wt % |
|---|---|---|
| 07MGE094-02 | 60 | 0.3125 |
| 07MGE094-03 | 60 | 0.5 |
| 07MGE094-04 | 60 | 1.25 |

Figure 14:
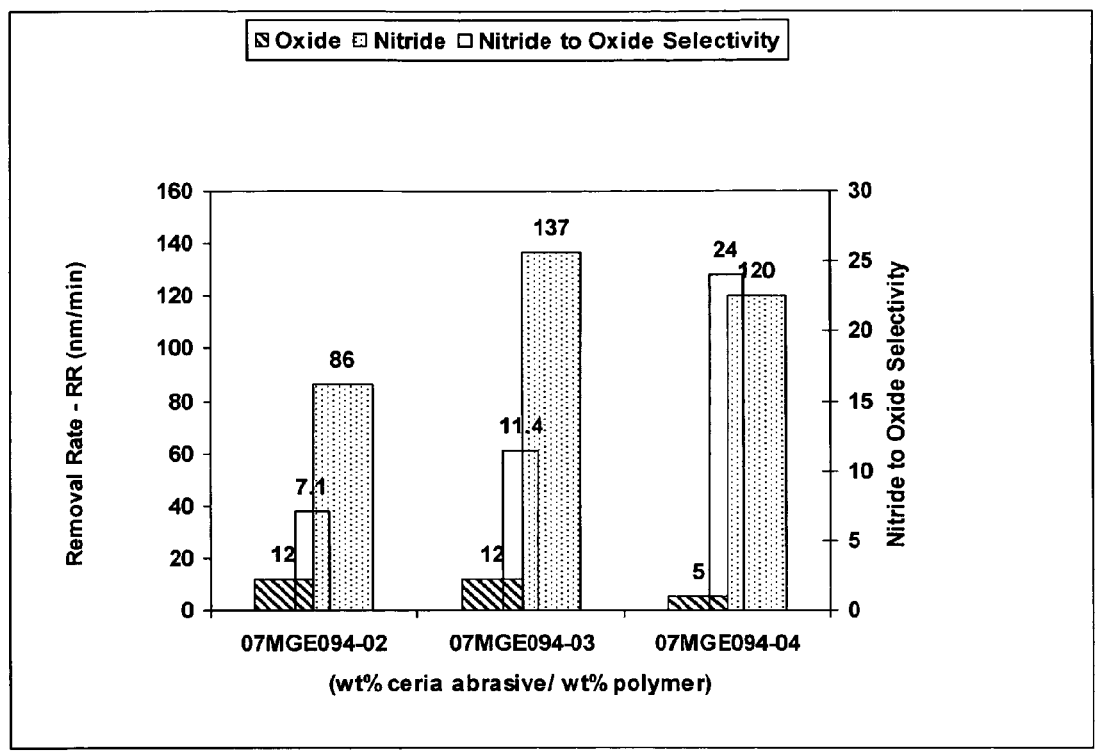
FIG. 14 shows illustrates the removal rate of nitride and oxide films with treated ceria particles containing varying wt % ceria particles to wt % polymer.

New blanket nitride and oxide films were polished with the above mentioned ceria slurry from Table 8. The slurry contained 0.25 wt % of treated ceria in DI water. The removal rate of nitride and oxide films with treated ceria particles containing 0.3125 wt %, 0.5 wt % and 1.25 wt % are shown in FIG. 14. It is evident that the nitride to oxide selectivity increased with the increase in the ceria to polymer weight ratio. The surface roughness values of the films (nitride and oxide) polished with the above mentioned samples are less than 1 nm as shown in Table 9. The removal rates with 1.25 wt % ceria to polymer ratio particles are consistent with the earlier results as shown in FIG. 10.

Figure 15:
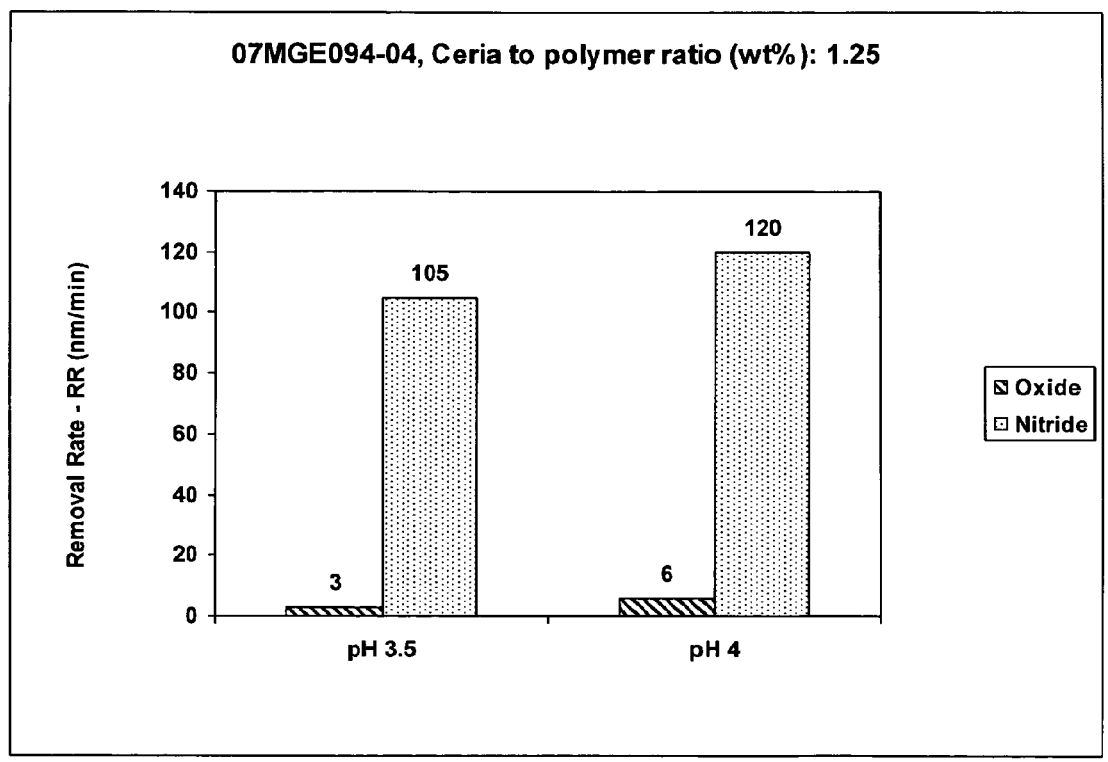
FIG. 15 illustrates the removal rates obtained by polishing nitride and oxide films at pH 3.5 and 4.

Referring to FIG. 14, Sample 07MGE094-04 with 1.25 wt % ceria to polymer ratio was used to polish nitride and oxide at pH 3.5 to compare and fine tune the removal rate. The data obtained by polishing nitride and oxide films at pH 3.5 is shown in FIG. 15. There is no significant change in the oxide removal rate at pH 3.5, but the nitride removal rate has come down from 120 nm/min at pH 4 to 105 nm/min at pH 3.5.

TABLE 9

Surface roughness measurements of post CMP oxide and nitride films.

| | Oxide | | Nitride | |
|---|---|---|---|---|
| Slurry | Sq (nm) | Peak/Valley (nm) | Sq (nm) | Peak/Valley (nm) |
| Before CMP (Virgin Films) | 0.7 | 6.3 | 0.8 | 6.9 |
| 0.25 wt % Ceria (60 nm, 07MGE094-02) in DI water at pH 4 | 0.7 | 11.2 | 0.9 | 7.6 |
| 0.25 wt % Ceria (60 nm, 07MGE094-03) in DI water at pH 4 | 0.8 | 7.4 | 0.8 | 6.6 |
| 0.25 wt % Ceria (60 nm, 07MGE094-04) in DI water at pH 4 | 0.8 | 7.6 | 0.8 | 8.9 |

Figure 16:
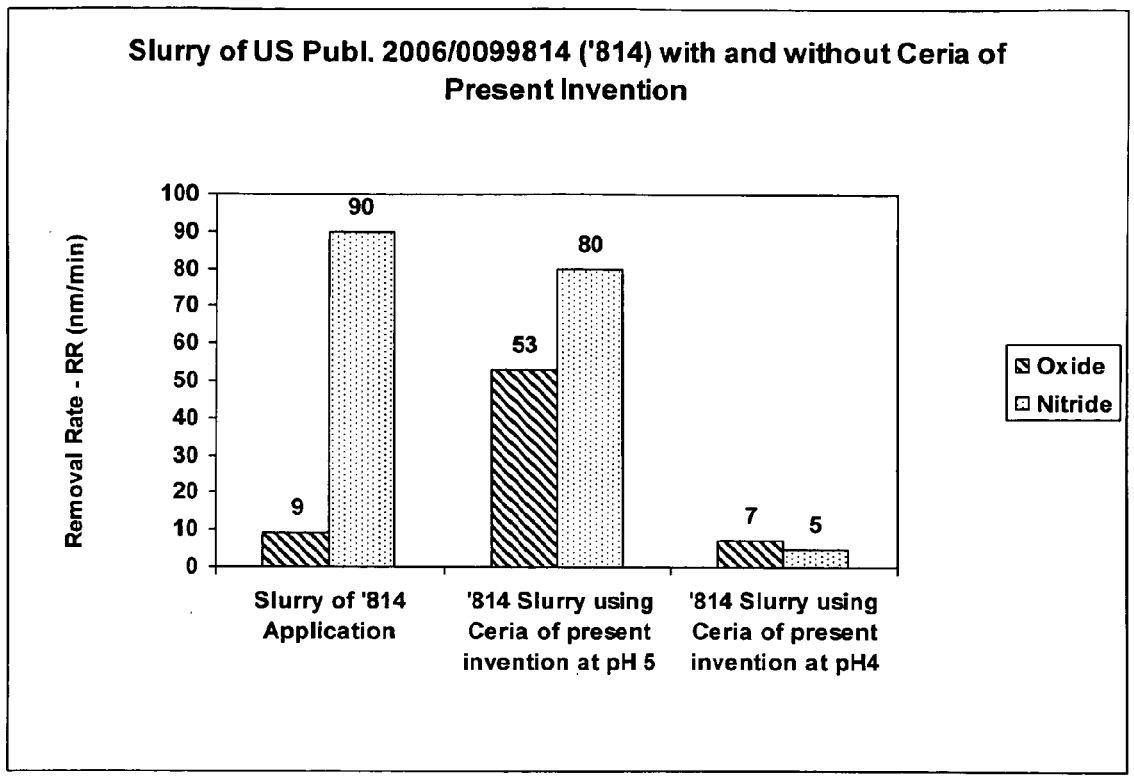
FIG. 16 shows the removal rate comparison with the '814 slurry alone and '814 slurry containing the ceria of the present invention at pH 4.9 and 4.

Referring now to FIG. 16, In order to test the ceria of the present invention in a slurry composition corresponding to US Publ. 2006/0099814 ('814), 07MGE077-01 sample was supplied with 0.4 wt % ceria, 400 ppm of 4-aminobutyric acid and 4 ppm of polyethyleneimine at pH 4.9. FIG. 16 shows the removal rate comparison with the '814 slurry alone and '814 slurry containing the ceria of the present invention at pH 4.9 and 4. The removal rates were reproducible with the (present invention) ceria and at pH 4, the removal rates of both nitride and oxide were suppressed to ~5 nm/min. The lowest oxide removal rate was observed with the 1.25 wt % ceria to polymer ratio 60 nm ceria particles, leading to a high nitride to oxide removal rate selectivity. We also observed that better nitride to oxide selectivity is achieved with higher ceria to polymer ratio at pH 4. The post CMP surface roughness is comparable to that of the virgin wafer roughness. The zeta potential measurements reveal that the ceria particles with higher ceria to polymer ratio are positively charged through out the pH range. 60 nm ceria particles with 0.5, 0.8 and 1.25 wt % ceria to polymer ratio were checked for reproducibility of removal rates. The removal rates of nitride and oxide films with the above mentioned ceria samples were consistent and repeatable and produced a selectivity of about 120:5.

Figure 17:
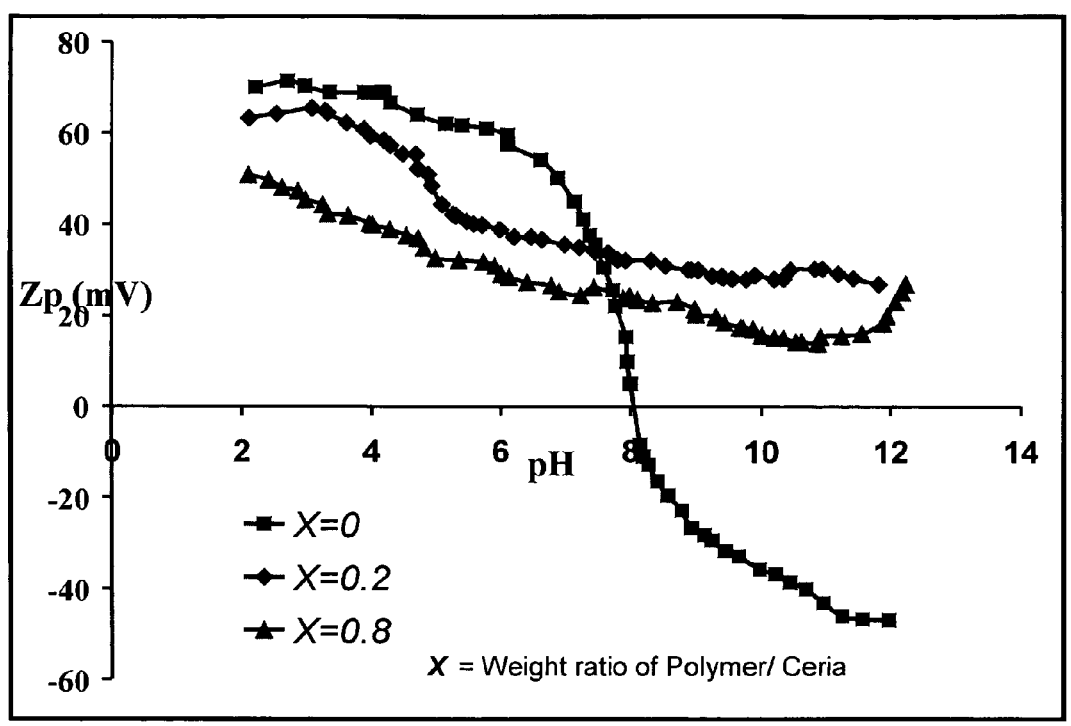
FIG. 17 shows the zeta potential of ceria (dmean ~60 nm) as a function of cationic polymer to abrasive ratio.
Figure 18:
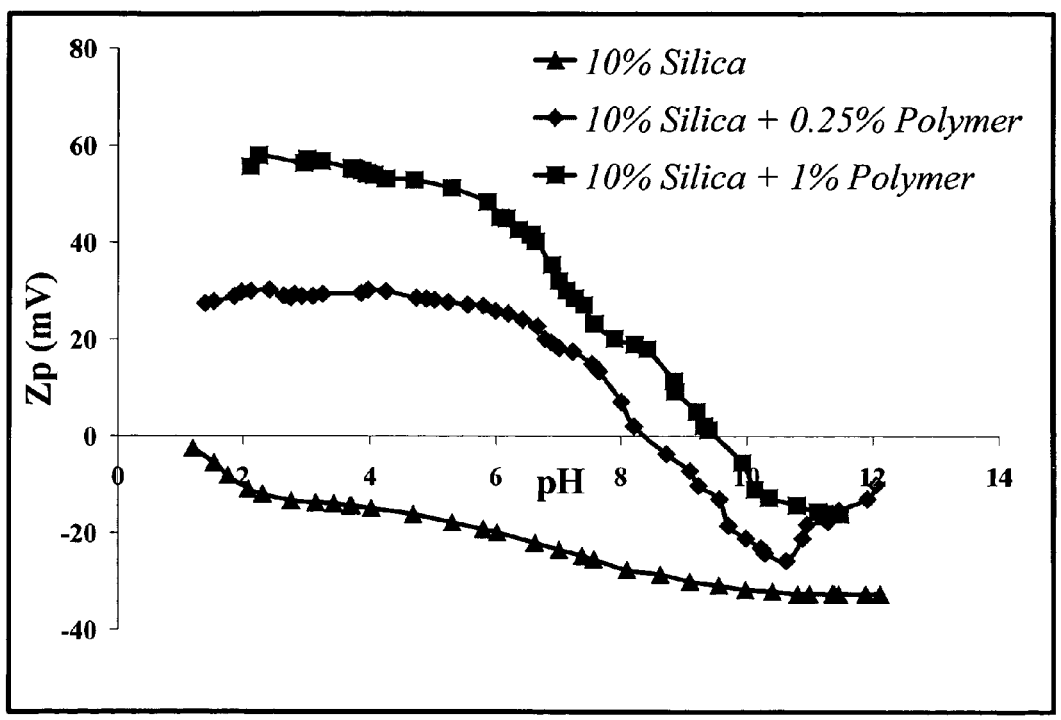
FIG. 18 shows the zeta potential of silica (dmean ~50 nm) as a function of cationic polymer to abrasive ratio.
Figure 19:
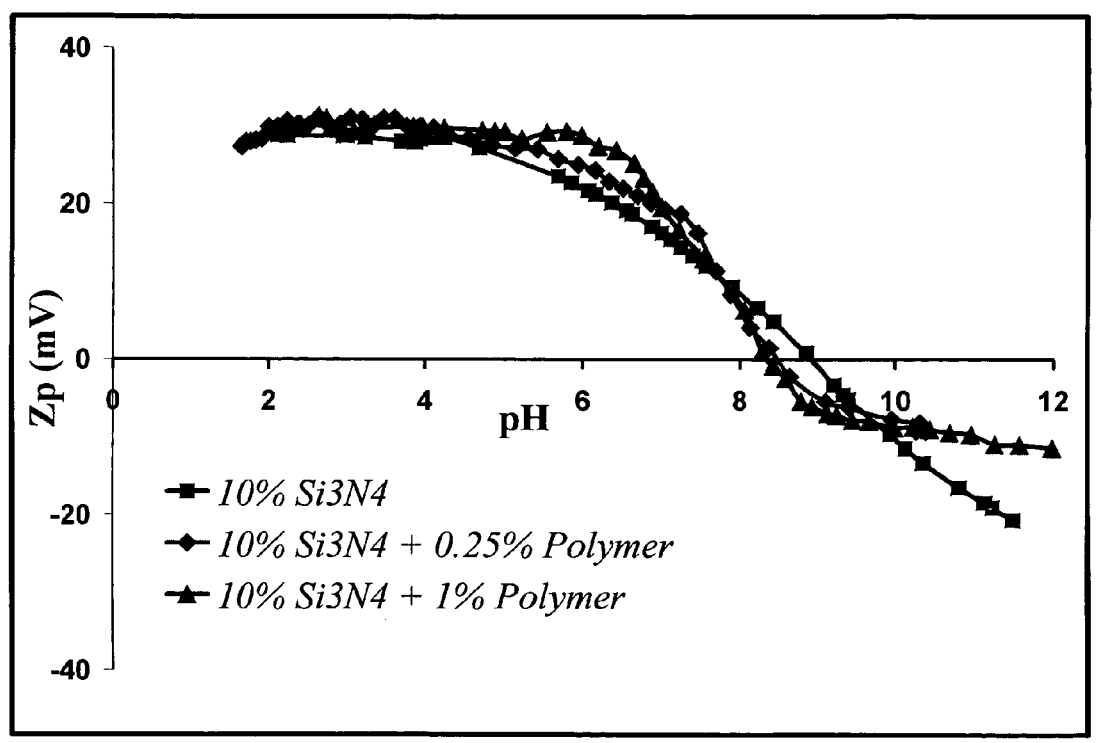
FIG. 19 shows the zeta potential of silicon nitride(dmean ~50 nm) as a function of cationic polymer to abrasive ratio.

Referring now to Figure to FIGS. 17-19, zeta potentials of ceria, silica and silicon nitride in the presence and absence of the polymer according to the present invention were measured to determine the role of electrostatic interactions, if any on the measured polish rates. As shown in FIG. 17, the isoelectric point (IEP) of ceria (no additive) was found to be ~8 and there was no IEP found for the ceria abrasives with X=0.2 and 0.8 in the pH range 2-12. Also throughout the pH range 2-12, magnitude of zeta potential on the ceria abrasives decreased in the presence of polymer when compared to the zeta potential in the absence of polymer.

FIG. 18 shows zeta potential measured of silica abrasives (10 wt %) in the presence and absence of the polymer according to the present invention. The IEP of silica (no additive) was found to be ~1.5 i.e., silica abrasive is negatively charged throughout the pH range 2-12. With the addition of 0.25% and 1% polymer to the silica slurry (10% particle loading), the IEP shifts to ~8.5 and ~9.5, respectively, suggesting modification of the silica surface by the polymer. Also, from the magnitude of the zeta potential change, it is believed that more polymer adsorbs on to the silica surface in case of 1% additive than with 0.25%. This is also confirmed later by TGA measurements.

FIG. 19 shows zeta potential of silicon nitride abrasives (10 wt %) in the presence and absence of the polymer. On addition of 0.25% and 1% polymer to the silicon nitride slurry (10% particle loading), there is no significant change in the zeta potential of silicon nitride in the pH range 2-12, which infers that there is no adsorption on to the silicon nitride surface. This is later confirmed by contact angle, frictional coefficient and TGA data.

Figure 20:
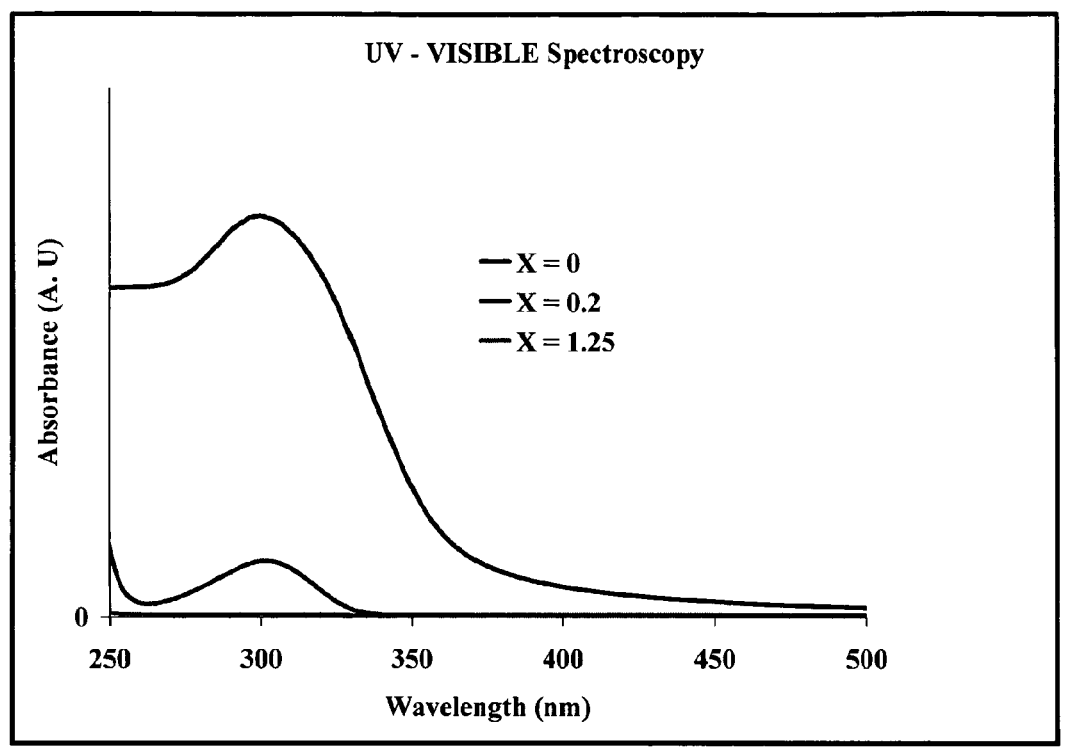
FIG. 20 shows absorption spectra of ceria slurries with different concentrations of additive.

FIG. 20 shows the absorption spectra of ceria slurries with different concentrations of additive. As shown in this figure, the maxima of absorption of $Ce^{3+}$ lies in the region 300-320 nm. It is believed that $Ce^{3+}$ ion, which is more reactive towards oxide, is the dominating species on the ceria surface, and that $Ce^{3+}$ is thermodynamically more stable than $Ce^{4+}$ in aqueous media. For the removal mechanism of silicon dioxide by ceria abrasives, Ce—OH and Ce—$(OH)_2^+$ on the ceria abrasives react with the Si—$O^-$ sites on the silicon dioxide surface to form Ce—O—Si. During polishing, the bond between Si in Ce—O—Si and the bulk silicon dioxide is broken due to the mechanical action. It is also believed that the silicon dioxide is removed as a lump rather than a monomer or oligomers of $Si(OH)_4$.

It is also believed that the relative concentration of $Ce^{3+}$, which leads to better polish rates, is higher in case of 0.25% when compared to 0.5% and 1% particle loadings. As shown in FIG. 20, relative concentration of $Ce^{3+}$ is much higher in case of X=0 when compared to X=0.2, where the relative concentration of $Ce^{3+}$ is higher than that of at X=1.25. This would appear to confirm that the adsorption of the cationic polymer on to the ceria abrasives increases as the additive concentration is increased in the slurry and thereby blocking the chemical reactivity of ceria towards oxide resulting in the suppression of oxide removal rate at X=1.25. This is consistent with the zeta potential, TGA, contact angle and frictional coefficient data.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A stable colloidal dispersion for chemical mechanical polishing comprising:
    (a) 0.05% to about 10% by weight of an abrasive component and
    (b) a water-soluble polymer comprising:
        (i) at least one part B comprising one or more cationic monomeric units, and
        (ii) at least one part A comprising one or more anionic monomeric units;
    wherein the dispersion has a pH of between about 1.5 and about 6;
    wherein polymer is an amphoteric copolymer selected from the group consisting of:
    (a) a (block A)-(block B) diblock copolymer, wherein the at least one part A is the block A and the at least one part B is the block B;
    (b) a (block B)-(block A)-(block B) triblock copolymer, wherein the at least one part A is the block A and the at least one part B is the block B; or
    (c) a (backbone A)-(side chains B) comb copolymer, wherein the at least one part A is the backbone A and the comb copolymer is a plurality of side chains B each bonded to the backbone A at one of their ends.

2. The dispersion of claim 1 wherein the dispersion has a pH of between about 3 and about 6.

3. The dispersion of claim 1 wherein the abrasive component comprises particles selected from the group consisting of:
    (a) an oxide, a hydroxide or an oxyhydroxide of cerium, titanium, silicon, zirconium, manganese, aluminum or iron;
    (b) a mixture of an oxide, a hydroxide or an oxyhydroxide of cerium with at least one other element chosen from rare earth metals or tin; and (c) a mixture of an oxide, a hydroxide or an oxyhydroxide of zirconium and of a trivalent rare earth metal.

4. The dispersion of claim 1 wherein the polymer is from about 0.2 to about 3% by weight of the abrasive component.

5. The dispersion of claim 1 wherein the amphoteric copolymer is a diblock copolymer, wherein the block A is derived from acrylic acid and the block B is derived from DADMAC.

6. The dispersion of claim 1 wherein the amphoteric copolymer is a triblock copolymer.

7. The dispersion of claim 1 wherein the dispersion is capable of polishing a substrate comprising silicon nitride and silicon oxide with a reverse selectivity ratio of between about 30 and about 120, the reverse selectivity ratio being the ratio of the rate of removal of the silicon nitride to the rate of removal of the silicon oxide.

8. The dispersion of claim 7 wherein the dispersion is capable of polishing a substrate comprising silicon nitride and silicon oxide with a reverse selectivity ratio of between about 40 and about 100.

9. The dispersion of claim 1 wherein the dispersion is capable of polishing a substrate comprising silicon nitride and silicon oxide with a reverse selectivity ratio of at least about 27, the reverse selectivity ratio being the ratio of the rate of removal of the silicon nitride to the rate of removal of the silicon oxide.

10. The dispersion of claim 9 wherein the dispersion is capable of polishing a substrate comprising silicon nitride and silicon oxide with a reverse selectivity ratio of at least about 30.

11. The dispersion of claim 10 wherein the dispersion is capable of polishing a substrate comprising silicon nitride and silicon oxide with a reverse selectivity ratio of at least about 50.

12. The dispersion of claim 1 wherein the abrasive component comprises cerium oxide particles exhibiting a mean particle size of between about 10 nm and about 200 nm.

13. The dispersion of claim 12 wherein the abrasive component comprises cerium oxide particles exhibiting a mean particle size of between about 20 nm and about 70 nm, and exhibiting a standard deviation value of at most 30% of the mean particle size.

14. The dispersion of claim 13 wherein the abrasive component comprises cerium oxide particles exhibiting a mean particle size of between about 55 nm and about 65 nm, and exhibiting a standard deviation value of at most 20% of the mean particle size.

15. The dispersion of claim 1 wherein the part B is derived from one or more ethylenically unsaturated monomers having quaternary ammonium groups or inium groups.

16. The dispersion of claim 15 wherein the quaternary ammonium group is a trialkylammonium group and wherein the inium group is an alkylpyridinium group.

17. The dispersion of claim 15 wherein the one or more ethylenically unsaturated monomers comprise trimethylammoniopropyl methacrylate chloride, trimethylammonioethylacrylamide, -methacrylamide chloride, -methacrylamide bromide, trimethylammoniobutylacrylamide, -methylacrylamide methyl sulphate, trimethylammoniopropylmethacrylamide methyl sulphate (MAPTA MeS), (3-methacrylamidopropyl)trimethylammonium chloride (MAPTAC), (3-acrylamidopropyl)trimethylammonium chloride (APTAC), methacryloyloxyethyltrimethylammonium chloride, methacryloyloxyethyltrimethylammonium chloride methyl sulphate, acryloyloxyethyltrimethylammonium salts (ADAMQUAT), 1-ethyl-2-vinylpyridinium, 1-ethyl-4-vinylpyridinium bromide, 1-ethyl-2-vinylpyridinium, 1-ethyl-4-vinylpyridinium chloride, 1-ethyl-2-vinylpyridinium, 1-ethyl-4-vinylpyridinium methyl sulphate, N,N-dimethyldiallylammonium chloride (DADMAC), dimethylaminopropylmethacrylamide, N-(3-chloro-2-hydroxypropyl)trimethylammonium chloride (DIQUAT), a monomer of formula:

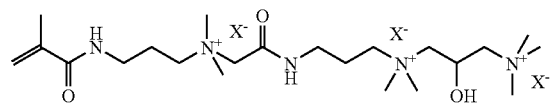

where X⁻ is an anion,
or any mixture thereof.

18. The dispersion of claim 15 wherein the part A is a macromolecular chain comprising anionic groups, the macromolecular chain derived from anionic monomers chosen from acrylic acid, acrylic anhydride, methacrylic acid, methacrylic anhydride, maleic acid, maleic anhydride, fumaric acid, itaconic acid, N-methacryloylalanine, N-acryloylglycine and their water-soluble salts, 2-sulphooxyethyl methacrylate, vinylbenzenesulphonic acid, allylsulphonic acid, 2-acrylamido-2-methylpropanesulphonic acid, sulphoethyl acrylate or methacrylate, sulphopropyl acrylate or methacrylate, and their water-soluble salts, vinylphosphonic acid, ethylenically unsaturated phosphate esters or any combination thereof.

19. The dispersion of claim 18 wherein the amphoteric copolymer is a comb copolymer.

* * * * *